(12) United States Patent
Fujimoto

(10) Patent No.: US 7,419,767 B2
(45) Date of Patent: Sep. 2, 2008

(54) PHASE-SHIFTING MASK AND METHOD OF FORMING PATTERN USING THE SAME

(75) Inventor: Masashi Fujimoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 586 days.

(21) Appl. No.: 10/921,159

(22) Filed: Aug. 19, 2004

(65) Prior Publication Data

US 2005/0019708 A1  Jan. 27, 2005

Related U.S. Application Data

(62) Division of application No. 10/061,283, filed on Feb. 4, 2002, now Pat. No. 6,800,402.

(30) Foreign Application Priority Data

Feb. 2, 2001 (JP) ............................ 2001-027210

(51) Int. Cl.
  *G03F 7/20* (2006.01)
  *G03F 7/00* (2006.01)
  *G03F 7/26* (2006.01)
(52) U.S. Cl. .................... 430/311; 430/5; 430/322; 430/394
(58) Field of Classification Search .............. 430/322, 430/5, 394, 311
See application file for complete search history.

(56) References Cited

U.S. PATENT DOCUMENTS

| 5,631,108 A | 5/1997 | Okamoto | |
|---|---|---|---|
| 6,503,666 B1 * | 1/2003 | Pierrat | 430/5 |
| 6,566,023 B2 * | 5/2003 | Wang et al. | 430/5 |
| 6,638,663 B1 * | 10/2003 | Jin | 430/5 |

FOREIGN PATENT DOCUMENTS

JP  62-50811  10/1987

* cited by examiner

Primary Examiner—Mark F. Huff
Assistant Examiner—Brittany Raymond
(74) Attorney, Agent, or Firm—Young & Thompson

(57) ABSTRACT

A phase-shifting mask suppresses increase of the minimum pattern-element size due to optical proximity effect. The mask a first pattern region formed on a transparent substrate, including a first blocking part for forming at least one first pattern element. The mask further includes a second pattern region on the substrate, including second blocking parts forming second pattern elements arranged periodically. The first pattern region includes first phase- and transparent parts. The second pattern region includes second phase-shifting and transparent parts. The intensity of exposing light through the first pattern region is set to be approximately equal to that of the light through the second pattern region. A third blocking part surrounds the first phase-shifting and transparent parts. A fourth blocking part surrounds the second phase-shifting and transparent parts.

11 Claims, 20 Drawing Sheets

PHASE-SHIFTING MASK AND METHOD OF FORMING PATTERN USING THE SAME

CROSS REFERENCE TO RELATED APPLICATIONS

This application is a division of application Ser. No. 10/061,283, filed on Feb. 4, 2002, the entire contents of which are hereby incorporated by reference.

BACKGROUND OF THE INVENTION

1. Field of the Invention

The present invention relates to an exposure mask used for the photolithography process as one of the semiconductor device fabrication processes. More particularly, the invention relates to a Levenson-type phase-shifting mask that suppresses effectively the optical proximity effect to thereby improve the resolution, and a method of forming a pattern using the mask.

2. Description of the Related Art

In recent years, high-speed operation and large-scale integration of semiconductor devices have been progressing further. According to this tendency, it has been required to further miniaturize the patterns of layers that form the devices.

More recently, the design rule has been decreased to approximately half of the wavelength of exposure light (i.e., exposure wavelength). Thus, it is extremely difficult to form small patterns with the size of approximately half of the exposure wavelength by using ordinary exposure methods. To cope with this, various types of "super-resolving technique" have been developed and discussed.

One of the known "super-resolving techniques" is the "phase-shifting mask". This mask is an exposure mask having a patterned phase-shifting layer selectively formed on the transparent parts (e.g., openings) of the transparent substrate. The patterned phase-shifting layer eliminates the effect of diffraction of exposure light passing through adjoining transparent parts, thereby raising the resolution of the mask.

The "Levenson-type" phase-shifting mask provides much enhancement of the resolution, which is disclosed, for example, in the Japanese Examined Patent Publication No. 62-50811 published in 1987. With the "Levenson-type phase-shifting mask", a patterned phase shifting layer is alternately formed on adjoining transparent parts of the transparent substrate. This is to make the light beams passing through the transparent parts opposite in phase to each other, thereby suppressing the interference between these two beams. In this way, the mask enhances its resolution.

The "Levenson-type" phase-shifting mask is very effective to enhancement of the resolution and the depth of focus for periodically-arranged pattern elements. This mask can resolve extremely miniaturized patterns with the size of approximately half of the exposure wavelength or less. Therefore, it has been thought that this type of mask is most hopeful as the technique that realizes formation of patterns with the size of approximately half of the exposure wavelength or less.

FIG. 3 shows an example of circuit or element patterns (hereinafter, which are referred as circuit/element patterns) to be formed. In FIG. 3, the circuit/element pattern 110 is used to pattern a conductive film formed on a gate dielectric film, thereby forming the gate electrodes of Metal-Oxide-Semiconductor Field-Effect Transistors (MOSFETs) and the wiring lines connected thereto. The pattern 110 is made of any photoresist film.

The circuit/element pattern 110 includes an isolated pattern section 113 with an isolated, L-shaped pattern element 113a and a periodic pattern section 114 with closely-arranged, linear pattern elements 114a. The isolated pattern section 113 includes the L-shaped pattern element 113a only, in which no other pattern elements are located near the element 113a. The periodic pattern section 114 includes the linear pattern elements 114a that are arranged in parallel at equal spaces or intervals, which is termed the Line and Space (L/S) pattern.

Actually, the circuit/element pattern 110 of FIG. 3 includes various types of other pattern elements than the elements 113a and 114a. However, they are omitted in FIG. 3 for the sake of simplification of explanation.

FIG. 1 shows a prior-art Levenson-type phase-shifting mask used to form the circuit/element pattern 110 of FIG. 3. FIG. 2 shows a prior-art ordinary (i.e., non-phase-shifting) mask (not the Levenson-type) used to form the same pattern 110.

The prior-art phase-shifting mask 120 of FIG. 1 is of the positive type. The mask 120 comprises an L-shaped blocking or light-shielding part 122a for forming the pattern element 113a of the pattern section 113 of the pattern 110 in FIG. 3 and six linear blocking parts 122b for forming the pattern elements 114a of the pattern section 114 of the same pattern 110. The mask 120 further comprises a rectangular phase-shifting part 123a formed closely to the blocking part 122a and three strip-shaped phase-shifting parts 123b arranged alternately in the spaces between the blocking parts 122b. The remaining area of the mask 120 is a transparent part 124.

In FIG. 1, a character "0" is attached to the transparent part 124, because no phase shift occurs in the exposure light passing through the part 124. A character "π" is attached to the phase-shifting parts 123a and 123b, because phase shift of "π (180°)" occurs in the exposure light passing through the parts 123a and 123b.

The blocking part 122a has the same shape as the pattern element 113a of the circuit/element pattern 110. Each of the blocking parts 122b has the same shape as a corresponding one of the pattern elements 114a of the pattern 110.

The prior-art non-phase-shifting mask 130 is of the positive type, like the phase-shifting mask 120. The mask 130 comprises a rectangular blocking part 132 that covers the blocking parts 122a and 122b of the mask 120 and the phase-shifting parts 123a and 123b thereof. The remaining area of the mask 130 is a transparent part 134. The blocking part 132 has a following relationship with the blocking parts 122a and 122b and the phase-shifting parts 123a and 123b of the phase-shifting mask 120.

Specifically, if the non-phase-shifting mask 130 is entirely overlapped with the phase-shifting mask 120, the upper edge 132a of the blocking part 132 of the mask 130 approximately accords with the upper edges 122aa and 122ba of the blocking parts 122a and 122b of the mask 120. In this state, the upper edges 123aa and 123ba of the phase-shifting parts 123a and 123b of the mask 120 are shifted upward from the upper edge 132a of the blocking part 132 in FIGS. 1 and 2, and overlapped with the transparent part 134.

Next, a method of forming the circuit-element pattern 110 of FIG. 3 using the phase-shifting mask 120 and the non-phase-shifting mask 130 with the double exposure method is explained below.

In the first exposure step, a photoresist film (not shown), which has been formed on an object 112 for pattern formation (e.g., a polysilicon film formed on the gate dielectric film), is irradiated by specific exposure light using the phase-shifting mask 120 of FIG. 1. At this time, a latent image having the same shape as the L-shaped blocking part 122a and the linear blocking parts 122b is formed in the photoresist film thus exposed.

In the first exposure step, an undesired latent image is formed in the photoresist film thus exposed, which is due to the "0-π phase edges" formed at the locations corresponding to the edges 123aa and 123ba of the phase-shifting parts 123a and 123b.

In the second exposure step, to eliminate the "0-π phase edges", the photoresist film is irradiated with the same exposure light as used in the first exposure step again using the non-phase-shifting mask 130 of FIG. 2.

Thereafter, the photoresist film including the latent image is developed with a known developing solution, thereby removing the unnecessary, irradiated parts of the photoresist film. Thus, the latent image is elicited, in other words, the photoresist film is patterned as desired. As a result, the circuit/element pattern 110 of FIG. 3 is formed on the object 112 for pattern formation.

With the pattern formation method using the above-described phase-shifting mask 120 and the non-phase-shifting mask 130, however, the following problem will occur.

Specifically, the intensity distribution of the exposure light that passes through the area of the mask 120 where the blocking parts 122b and the phase-shifting parts 123b are periodically arranged is very different from the intensity distribution of the exposure light that passes through the area of the mask 120 where the blocking part 122a and the phase-shifting part 123a are formed. It is thought that this is due to the "optical proximity effect". As a result, there arises a problem that the minimum size of discriminable or formable pattern elements increases.

FIG. 4 shows the intensity change of the exposing light passing through the phase-shifting mask 120 as a function of the position, where the light intensity is shown with relative values. In FIG. 4, each of the periodically-arranged blocking parts 122b has a width of 0.1 μm, each of the periodically-arranged phase-shifting parts 123b has a width of 0.2 μm, the isolated blocking part 122a has a width of 0.1 μm, and the isolated phase-shifting part 122b has a width of 1.6 μm. The lateral axis of FIG. 4 denotes the distance from the center line of the blocking part 122a or 122b in a perpendicular direction thereto. The position "0" is located on the line.

As seen from FIG. 4, both the exposing light passing through the area corresponding to the isolated blocking part 122a and the isolated phase-shifting part 123a and the exposing light passing through the periodically-arranged blocking part 122b and the periodically-arranged phase-shifting part 123b have increasing intensities with the increasing distance from the center line of the part 122a. However, the increasing rate of the light intensity for the isolated parts 122a and 123a is less than that for the periodically-arranged parts 122b and 123b. Therefore, as shown in FIG. 5, if the inter-element distance (i.e., the distance between adjoining pattern elements) is larger than 0.5 μm (i.e., the pattern element approaches its isolation state), the minimum, formable pattern-element size for the photoresist film increases abruptly.

SUMMARY OF THE INVENTION

Accordingly, an object of the present invention is to provide a Levenson-type phase-shifting mask that suppresses effectively the increase of the minimum, formable pattern-element size due to the above-described "optical proximity effect", and a method of forming a pattern using the mask.

Another object of the present invention is to provide a Levenson-type phase-shifting mask that improves further the resolution, and a method of forming a pattern using the mask.

The above objects together with others not specifically mentioned will become clear to those skilled in the art from the following description.

According to a first aspect of the invention, a phase-shifting mask is provided. This mask is preferably used to form a pattern including at least one first pattern element and periodically-arranged second pattern elements. This mask comprises:

(a) a transparent substrate;

(b) a first pattern region formed on the substrate;

the first pattern region including a first blocking part for forming at least one first pattern element;

(c) a second pattern region formed on the substrate;

the second pattern region including second blocking parts for forming second pattern elements arranged periodically;

(d) in the first pattern region, a first phase-shifting part formed at one side of the first blocking part and a first transparent part formed at an opposite side of the first blocking part to the first phase-shifting part;

(e) in the second pattern region, a second phase-shifting part formed at one side of each of the second blocking parts and a second transparent part formed at an opposite side of the second blocking part to the second phase-shifting part;

(f) a width of the first-phase shifting part in the first pattern region having a relationship with a width of the second-phase shifting part in the second pattern region in such a way that an intensity of exposing light penetrated through the first pattern region is approximately equal to an intensity of the exposing light penetrated through the second pattern region;

(g) a third blocking part formed on the substrate to surround the first phase-shifting part and the first transparent part in the first pattern region; and (h) a fourth blocking part formed on the substrate to surround the second phase-shifting part and the second transparent part in the second pattern region.

With the phase-shifting mask according to the first aspect of the invention, the first pattern region, which includes the first blocking part for forming the at least one first pattern element, is formed on the transparent substrate. The second pattern region, which includes the second blocking parts for forming the periodically-arranged second pattern elements, is formed on same the substrate. In the first pattern region, the first phase-shifting part and the first transparent part are formed at each side of the first blocking part. In the second pattern region, the second phase-shifting part and the second transparent part are formed at each side of each of the second blocking parts. Moreover, the width of the first-phase shifting part in the first pattern region has a relationship with the width of the second-phase shifting part in the second pattern region in such a way that the intensity of exposing light penetrated through the first pattern region is approximately equal to the intensity of the exposing light penetrated through the second pattern region.

Therefore, the intensity of exposing light penetrated through the first pattern region can be approximately equal to the intensity of the exposing light penetrated through the second pattern region. This means that the "optical proximity effect" is effectively suppressed. As a result, the dispersion or fluctuation of the minimum pattern element size that can be formed by the mask of the invention is significantly reduced, improving the resolution.

Moreover, the third blocking part is formed on the substrate to surround the first phase-shifting part and the first transparent part in the first pattern region. The fourth blocking part is formed on the substrate to surround the second phase-shifting part and the second transparent part in the second pattern region. Accordingly, no 0-π phase edge exists and thus, the opposite-phase interference at the 0-π phase edges is prevented.

In a preferred embodiment of the mask according to the first aspect of the invention, the at least one first pattern element is an isolated pattern element. This is because it is advantageous that the invention is applied to such an isolated pattern element.

In this embodiment, it is preferred that the first phase-shifting part of the first pattern region has a width 0.9 to 1.4 times as large as a width of the second phase-shifting part of the second pattern region. This is because the advantages of the invention are obtainable. Moreover, it is more preferred that the first phase-shifting part of the first pattern region has a width approximately equal to a width of the second phase-shifting part of the second pattern region. This is because the advantages of the invention are most conspicuous.

In another preferred embodiment of the mask according to the first aspect of the invention, the at least one first pattern element is pattern elements periodically arranged at larger intervals (i.e., spaces) than the second pattern elements. In this embodiment, it is preferred that the intervals of the periodically-arranged pattern elements are approximately twice as large as that of the second pattern elements or larger. This is because each of the periodically-arranged pattern elements can be thought as an isolated pattern element even in this case.

In this embodiment, it is preferred that the first phase-shifting part of the first pattern region has a width 0.9 to 1.4 times as large as a width of the second phase-shifting part of the second pattern region. This is because the advantages of the invention are obtainable. Moreover, it is more preferred that the first phase-shifting part of the first pattern region has a width approximately equal to a width of the second phase-shifting part of the second pattern region. This is because the advantages of the invention are most conspicuous.

In still another preferred embodiment of the mask according to the first aspect of the invention, the third blocking part of the first pattern region and the fourth blocking part of the second pattern region are combined together. In this embodiment, there is an additional advantage that the shape of pattern elements for exposing the third and fourth blocking parts is simplified in a mask to be used in the second exposure step performed after the first exposure step that uses the mask according to the first aspect of the invention.

According to a second aspect of the invention, a method of forming a pattern is provided, in which the mask of the first aspect except of the invention is used. The method comprises:
(a) providing one of the above-described phase-shifting masks according to the first aspect of the invention as a first mask;
(b) providing a non-phase-shifting second mask;
the second mask including a transparent substrate, a fifth blocking part that covers entirely the first blocking part of the first mask, a sixth blocking part that covers entirely the second blocking part of the first mask, and a third transparent part for exposing the third and fourth blocking parts of the first mask;
(c) selectively irradiating exposing light to a photoresist film formed on an pattern-formation object using the first mask;
(d) selectively irradiating the exposing light to the photoresist film using the second mask after (c); and
(e) developing the photoresist film after (d).

With the method of forming a pattern according to the second aspect of the invention, the phase-shifting mask of the first aspect of the invention is used as the first mask for exposing the photoresist film in the first exposure process. Thereafter, the second mask having the configuration of (b) is used for exposing the same photoresist film in the second exposure process. Thus, desired pattern is formed in the photoresist film.

Thus, the "optical proximity effect" is suppressed effectively and as a result, the deviation of the minimum, formable pattern element size is remarkably reduced. This leads to improvement of resolution.

Additionally, the unexposed area of the photoresist film in the first exposure process using the first mask, in which the light is blocked by the third and fourth blocking parts, is exposed to the light in the second exposure process using the second mask. Therefore, no bad effect occurs even if the first mask includes the third and fourth blocking parts.

In a preferred embodiment of the method according to the second aspect of the invention, when the second mask is overlapped with the first mask, an edge of the fifth blocking part of the second mask is located in the first phase-shifting part of the first mask while an opposite edge of the fifth blocking part of the second mask is located in the first transparent part of the first mask. At the same time, an edge of the sixth blocking part of the second mask is located in the corresponding second phase-shifting part or the second transparent part of the first mask while an opposite edge of the sixth blocking part of the second mask is located in the corresponding second phase-shifting part or the second transparent part of the first mask. This is because the second mask is prevented from badly affecting in (d) the latent image formed in the photoresist film with the first mask.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
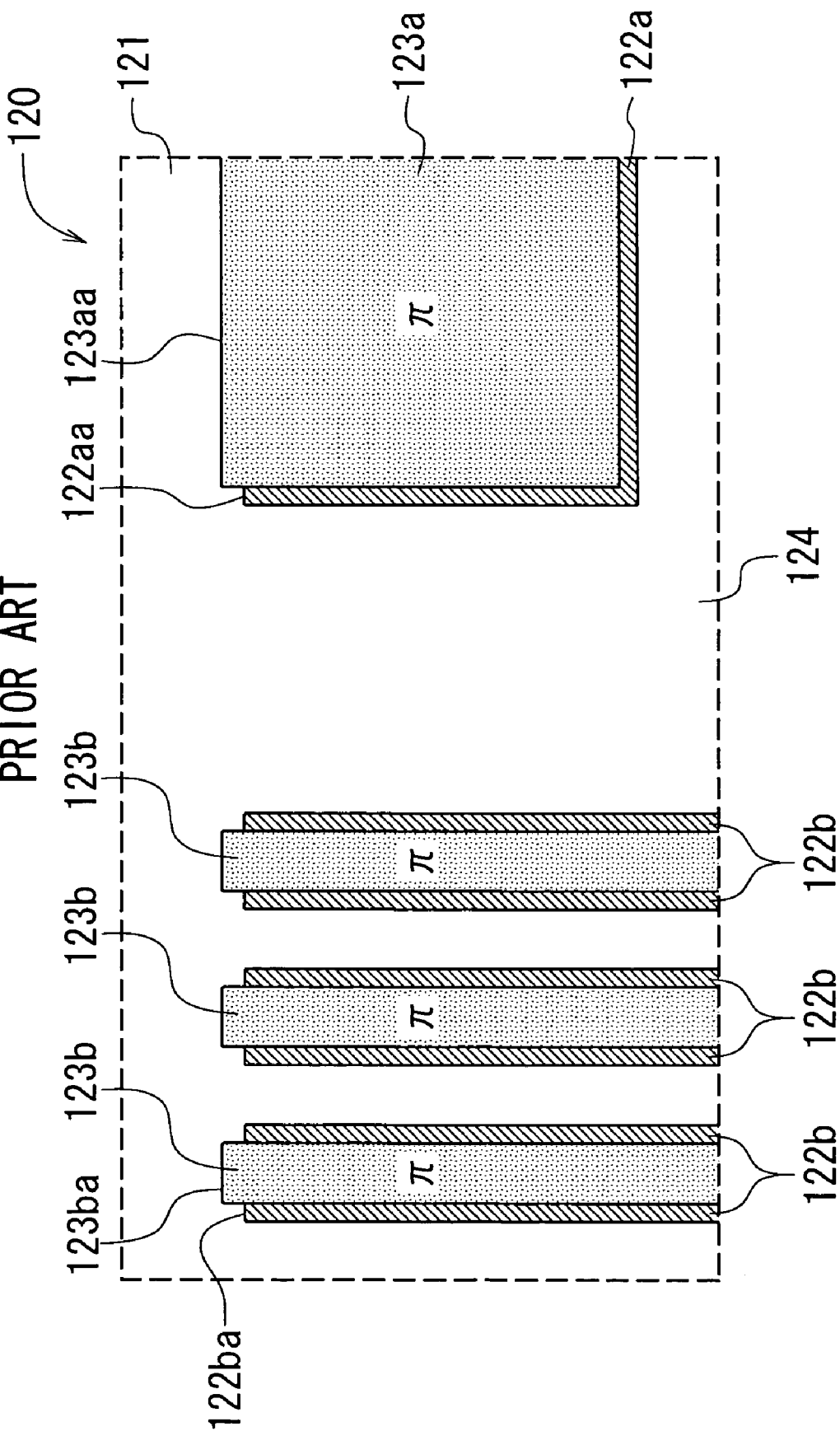
FIG. 1 is a schematic plan view showing an example of the configuration of a prior-art phase-shifting mask, which is used in a prior-art pattern formation method.
Figure 2:
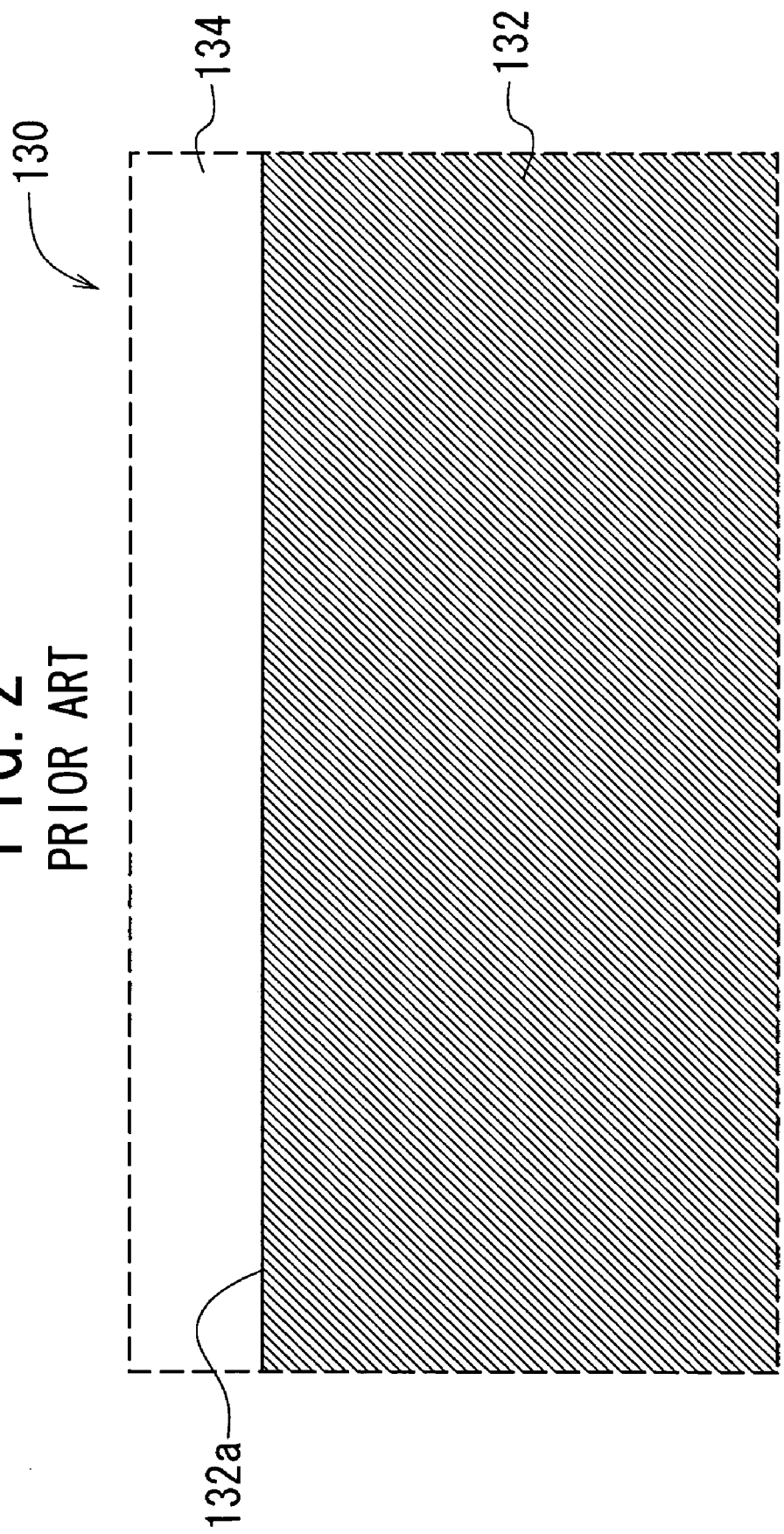
FIG. 2 is a schematic plan view showing an example of the configuration of a prior-art non-phase-shifting mask, which is used in the prior-art pattern formation method.

Preferred embodiments of the present invention will be described in detail below while referring to the drawings attached.

First Embodiment

Figure 6:
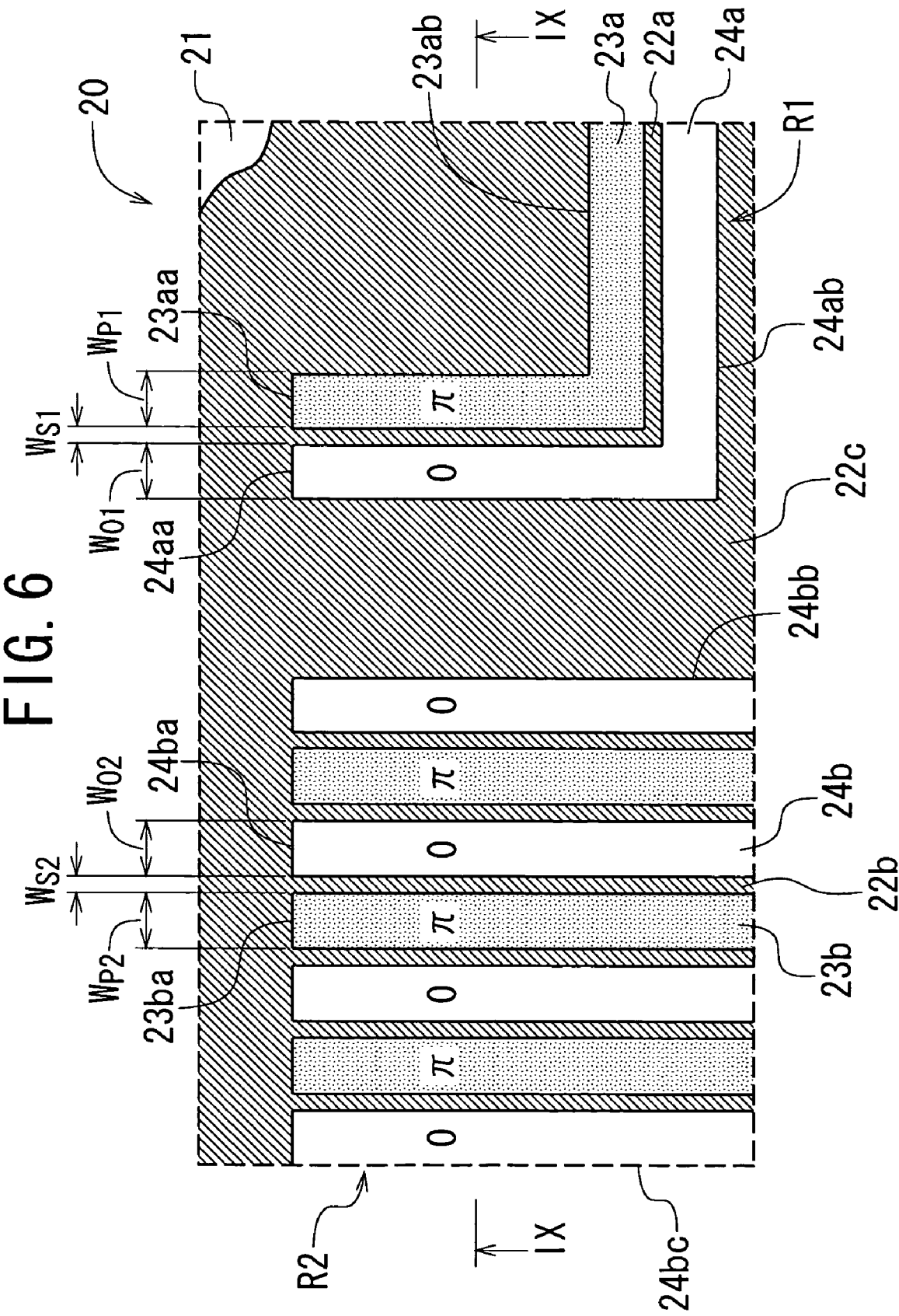
FIG. 6 is a schematic plan view showing the configuration of a phase-shifting mask according to a first embodiment of the invention, which is used in a pattern formation method according to the first embodiment.
Figure 8:
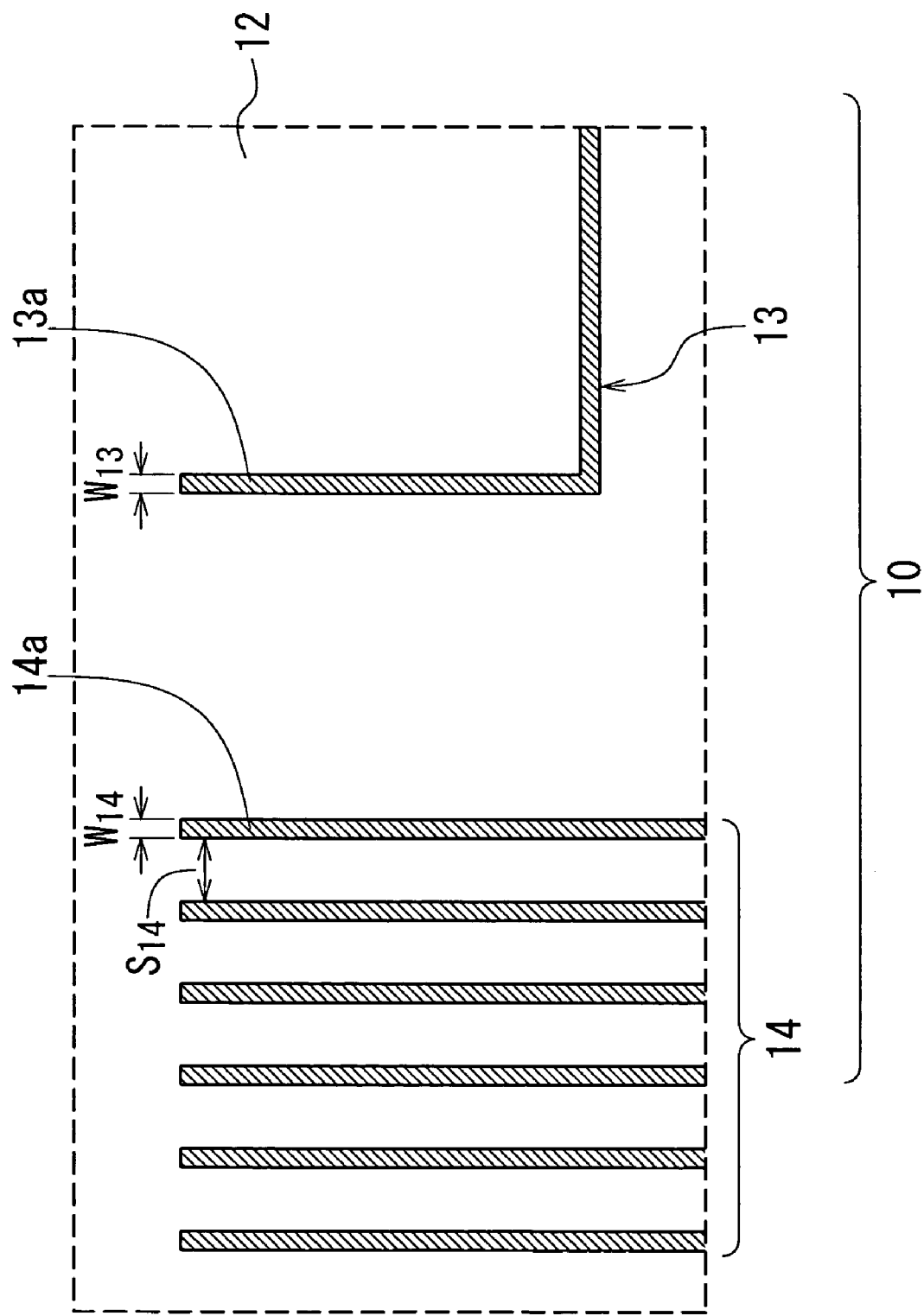
FIG. 8 is a schematic plan view showing a circuit/element pattern to be formed by the pattern formation method of the first embodiment.

FIG. 8 shows a circuit/element pattern 10 to be formed using a Levenson-type phase-shifting mask 20 according to a first embodiment shown in FIG. 6. This pattern 10 is used to pattern a conductive film formed on a gate dielectric film, thereby forming the gate electrodes of MOSFETs and the wiring lines connected thereto. The pattern 10 is made of any photoresist film.

The circuit/element pattern 10 shown in FIG. 8 includes an isolated pattern region 13 with an isolated, L-shaped pattern element 13a and a L/S periodic pattern section 14 with six closely-arranged, linear pattern elements 14a. The isolated pattern section 13 includes the L-shaped pattern element 13a only, in which no other pattern elements are located near the element 13a. The periodic pattern section 14 includes the six linear pattern elements 14a that are arranged in parallel at equal intervals. In other words, the section 14 has a L/S pattern.

The L-shaped element 13a has a width $W_{13}$ of 0.1 μm. Each of the linear elements 14a has a width $W_{14}$ of 0.1 μm and a space or interval $S_{14}$ of 0.2 μm.

Actually, the circuit/element pattern 10 of FIG. 8 includes various types of other pattern elements than the elements 13a and 14a. However, they are omitted in FIG. 8 for the sake of simplification of explanation.

Figure 9:
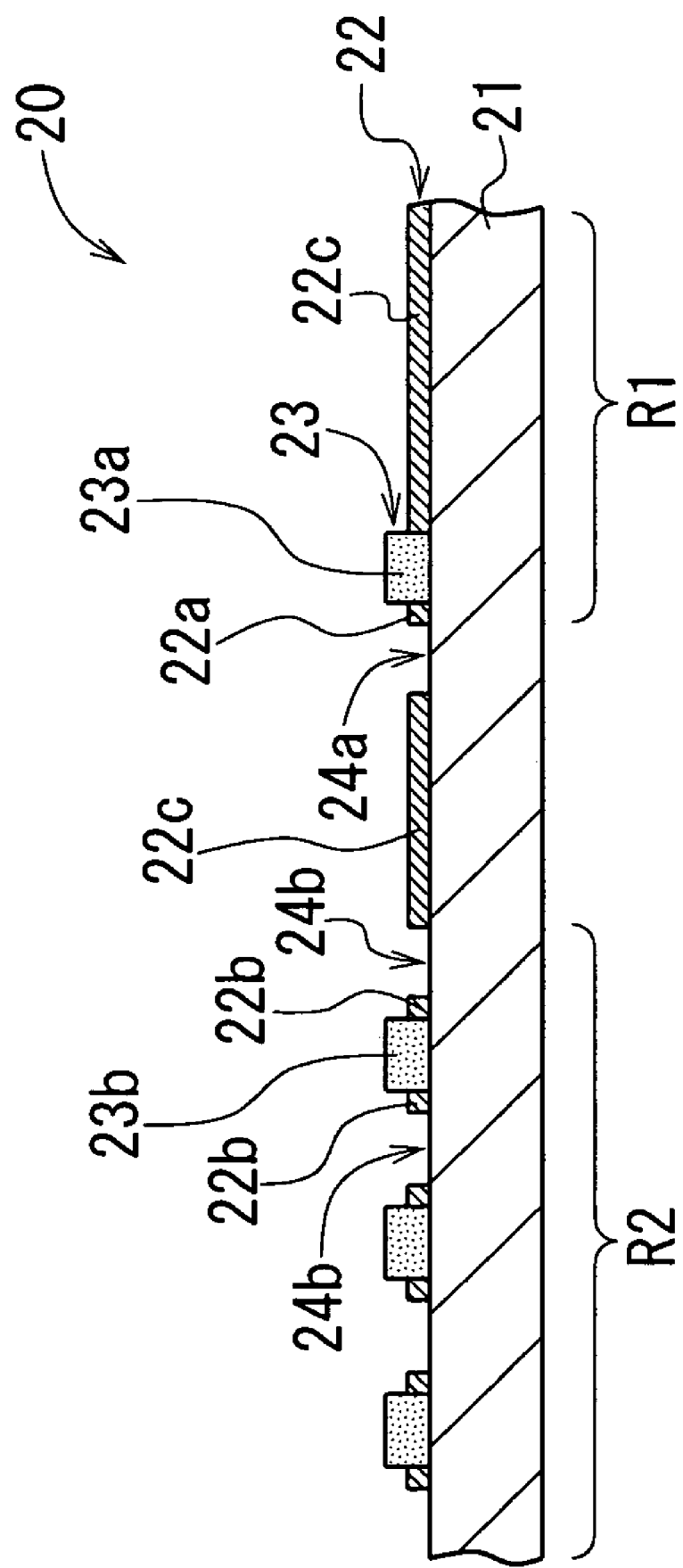
FIG. 9 is a cross-sectional view along the line IX-IX in FIG. 6.
Figure 10:
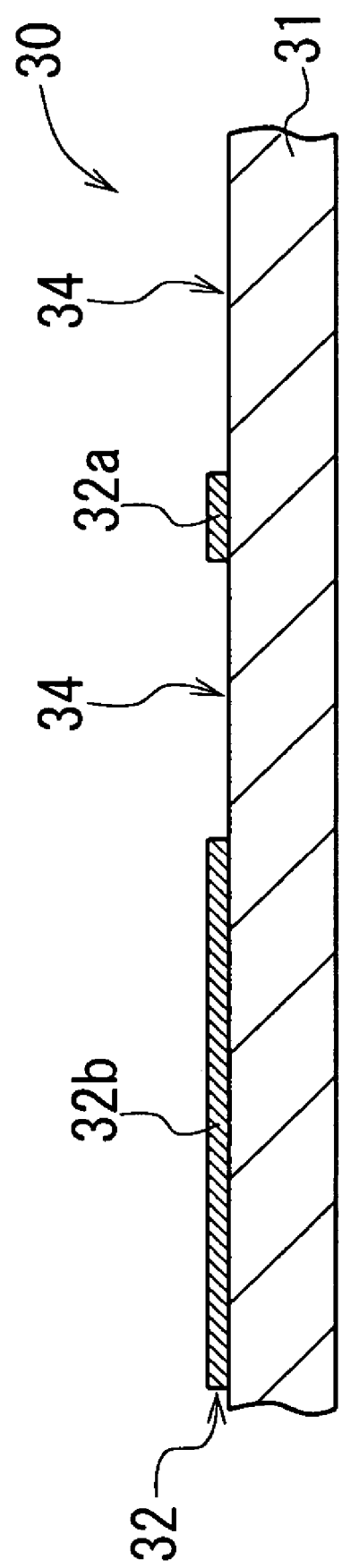
FIG. 10 is a cross-sectional view along the line X-X in FIG. 7.

FIG. 6 shows the configuration of the phase-shifting mask 20 according to the first embodiment and FIG. 9 shows the cross-section along the line IX-IX in FIG. 6. This mask 20 is of the Levenson type.

Figure 3:
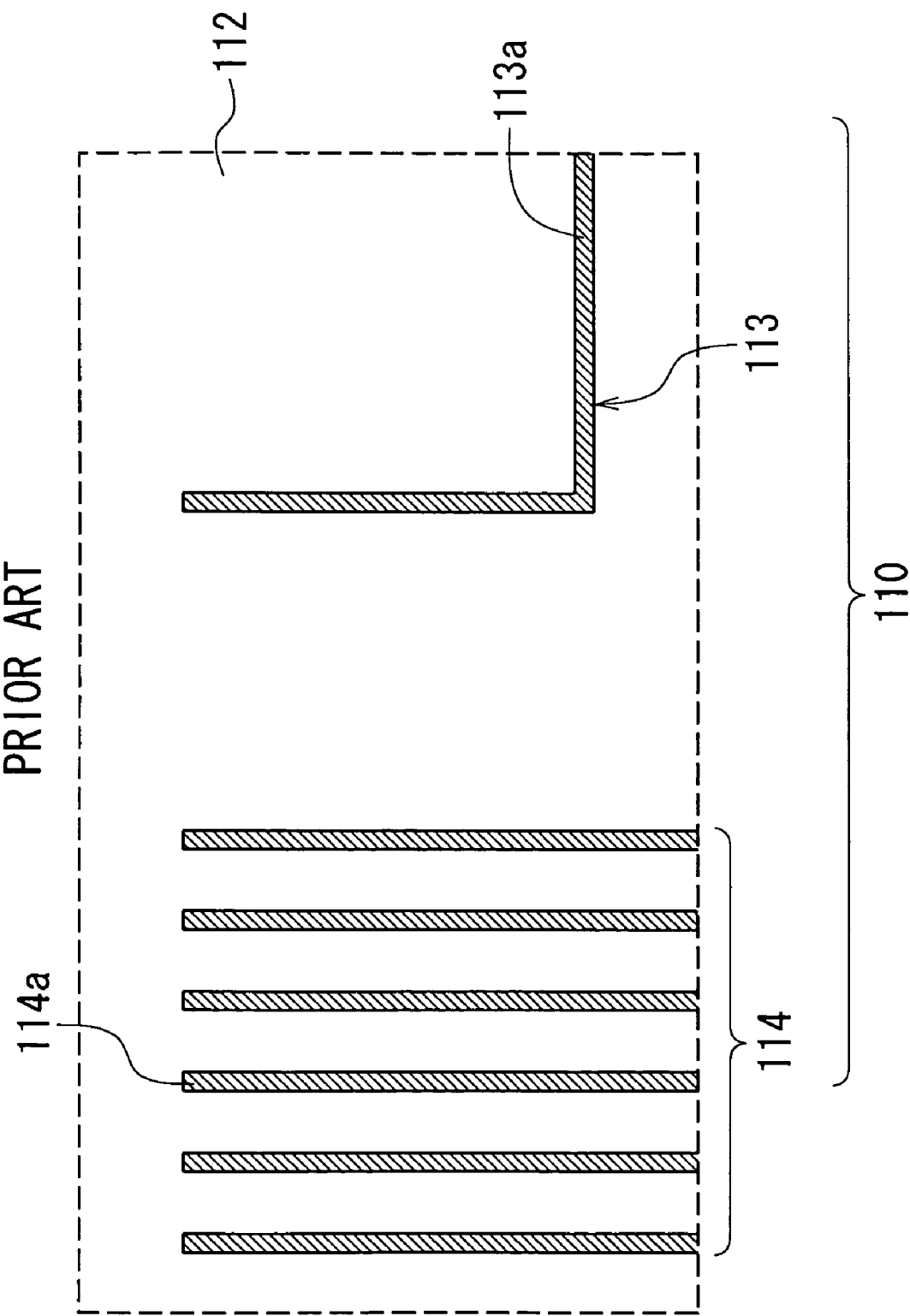
FIG. 3 is a schematic plan view showing a circuit/element pattern to be formed by the prior-art pattern formation method.

The mask 20, which is of the positive type, comprises a first pattern region R1 corresponding to the isolated pattern section 13 of the circuit/element pattern 10 of FIG. 3 and a second pattern region R2 corresponding to the L/S pattern section 14 of the same pattern 10. The first and second pattern regions R1 and R2 are formed on a main surface of a transparent substrate 21.

In the first pattern region R1, a L-shaped blocking or light-shielding part 22a, which blocks exposing light, is formed to form the L-shaped pattern element 13a of the isolated pattern section 13. A L-shaped, strip-like phase-shifting part 23a is closely formed at one side of the part 22a while a L-shaped, strip-like transparent part 24a is closely formed at the other side of the part 22a. Thus, the blocking part 22a is sandwiched by the phase-shifting part 23a and the transparent part 24a. These two parts 23a and 24a extend along the blocking part 22a from its one end to the other.

In the second pattern region R2, six linear blocking parts 22b are formed in parallel at equal intervals to form the six linear pattern elements 14a of the periodic pattern section 14. A straight strip-like phase-shifting part 23b is closely formed at one side of each part 22b while a straight strip-like transparent part 24b is closely formed at the other side thereof. Thus, each of the blocking parts 22b is sandwiched by the phase-shifting part 23b and the transparent part 24b. These two parts 23b and 24b extend along the corresponding blocking part 22b from its one end to the other.

In the other region of the surface of the substrate 21 than the first and second pattern regions R1 and R2, a remaining blocking part 22c is formed. This is quite different from the prior-art phase-shifting mask 120 of FIG. 1 where the other region is the transparent part 124.

The blocking parts 22a, 22b, and 22c and the phase-shifting parts 23a and 23b are formed in the following way.

Specifically, as shown in FIG. 9, a blocking layer 22 is formed on the main surface of the transparent substrate 21 and then, the layer 22 thus formed is patterned, thereby forming the blocking parts 22a, 22b, and 22c. A phase-shifting layer 23 is formed on the main surface of the substrate 21 and then, the layer 23 thus formed is patterned, thereby forming the phase-shifting parts 23a and 23b. The transparent parts 24a and 24b are formed by the area of the substrate 21 where none of the layers 22 and 23 are placed.

In FIG. 6, a character "0" is attached to the transparent parts 24a and 24b, because no phase shift occurs in the exposure light passing through the parts 24a and 24b. A character "π" is attached to the phase-shifting parts 23a and 23b, because phase shift of "π (180°)" occurs in the exposure light passing through the parts 23a and 23b.

In the first pattern region R1 of the mask 20, the L-shaped blocking part 22a has the same shape as the pattern element 13a of the isolated pattern section 13 of the circuit/element pattern 10 of FIG. 8. The width $W_{S1}$ of the blocking part 22a is equal to the width $W_{13}$ of the L-shaped element 13a of the pattern 10, i.e., $W_{S1}=W_{13}=0.1$ μm.

The L-shaped phase-shifting part 23a extends along the L-shaped blocking part 22a and has an approximately the same shape as the L-shaped pattern element 13a of the pattern 10. The width $W_{P1}$ of the phase-shifting part 23a is equal to the width $W_{P2}$ of the linear phase-shifting part 23b. Since the width $W_{P2}$ of the part 23b is equal to the space $S_{14}$ of the elements 14a of the pattern 10, the relationship of $W_{P1}=W_{P2}=S_{14}=0.2$ μm is established.

The L-shaped transparent part 24a extends along the L-shaped blocking part 22a and has an approximately the same shape as the blocking part 22a. The width $W_{O1}$ of the transparent part 24a is equal to the width $W_{P1}$ of the L-shaped phase-shifting part 23a, i.e., $W_{O1}=W_{P1}=0.2$ μm.

In the second pattern region R2 of the mask 20, each of the linear blocking parts 22b has the same shape as the linear pattern element 14a of the periodic pattern section 14 of the circuit/element pattern 10 of FIG. 8. The width $W_{S2}$ of the blocking parts 22b is equal to the width $W_{14}$ of the linear element 14a of the pattern 10, i.e., $W_{S2}=W_{14}=0.1$ μm.

Each of the linear phase-shifting parts 23b extends parallel to the corresponding linear pattern element 13b of the pattern 10 and has an approximately same shape as the element 13b. The width $W_{P2}$ of the phase-shifting parts 23b is equal to the width $W_{P1}$ of the L-shaped phase-shifting part 24a in the first pattern region R1. Since the width $W_{P2}$ of the part 23b is equal to the space $S_{14}$ of the elements 14a of the pattern 10, the relationship of $W_{P2}=W_{P1}=S_{14}=0.2$ μm is established.

Each of the linear transparent parts 24b extends parallel to the corresponding linear pattern element 13b of the pattern 10 and has an approximately the same shape as the element 13b. The width $W_{O2}$ of the transparent parts 24b is equal to the width $W_{P2}$ of the phase-shifting parts 23b, i.e., $W_{O2}=W_{P2}=0.2$ μm.

The remaining area of the surface of the substrate 21 other than the first and second pattern regions R1 and R2 is covered with the remaining blocking part 22c.

All the linear blocking parts 22b have the same length as that of the phase-shifting parts 23b and the transparent parts 24b. All the blocking parts 22b are connected to the blocking part 22c at the ends of the parts 23b and 24b.

With the above-described phase-shifting mask 20 according to the first embodiment, on the surface of the transparent substrate 21, the first pattern region R1 including the isolated blocking part 22a, and the second patter region R2 including the six blocking parts 22b periodically arranged far away from the region R1 are formed. The remaining area of the surface of the substrate 21 that excludes the regions R1 and R2 is covered with the remaining blocking part 22c. The width $W_{P1}$ of the L-shaped phase-shifting part 23a in the first region R1 is equal to the width $W_{P2}$ of the linear phase-shifting parts 23b in the second region R2, i.e., $W_{P1}=W_{P2}$.

Thus, the opposite phase interference at the 0-π edges is suppressed in the first pattern region R1 and accordingly, the intensity of the penetrated light through the second pattern region R2 can be approximately equalized to the intensity of the penetrated light through the first pattern region R1. In other words, the intensity distribution of the penetrated light through the first and second pattern regions R1 and R2 can be approximately uniformized. This means that the "optical proximity effect" can be suppressed effectively.

As a result, the dispersion or fluctuation of the minimum size of discriminable or formable pattern elements using the phase-shifting mask 20 of the first embodiment can be significantly reduced, improving the resolution. This highly contributes to the increase in fabrication yield.

In contrast, with the previously-described prior-art phase-shifting mask 120 of FIG. 1, the phase-shifting part 123a adjacent to the isolated, L-shaped blocking part 122a is much wider than the phase-shifting parts 123b adjacent to the periodically-arranged linear blocking parts 122b. Therefore, the opposite phase interference occurs very strongly at the 0-π edges near the boundary of the parts 123a and 124a. As a result, the light intensity is excessively suppressed within the considerably wide range away from the L-shaped blocking part 122a. This leads to non-uniformity of the intensity distribution of the penetrated light. However, this problem can be solved with the phase-shifting mask 20 of the first embodiment.

Figure 7:
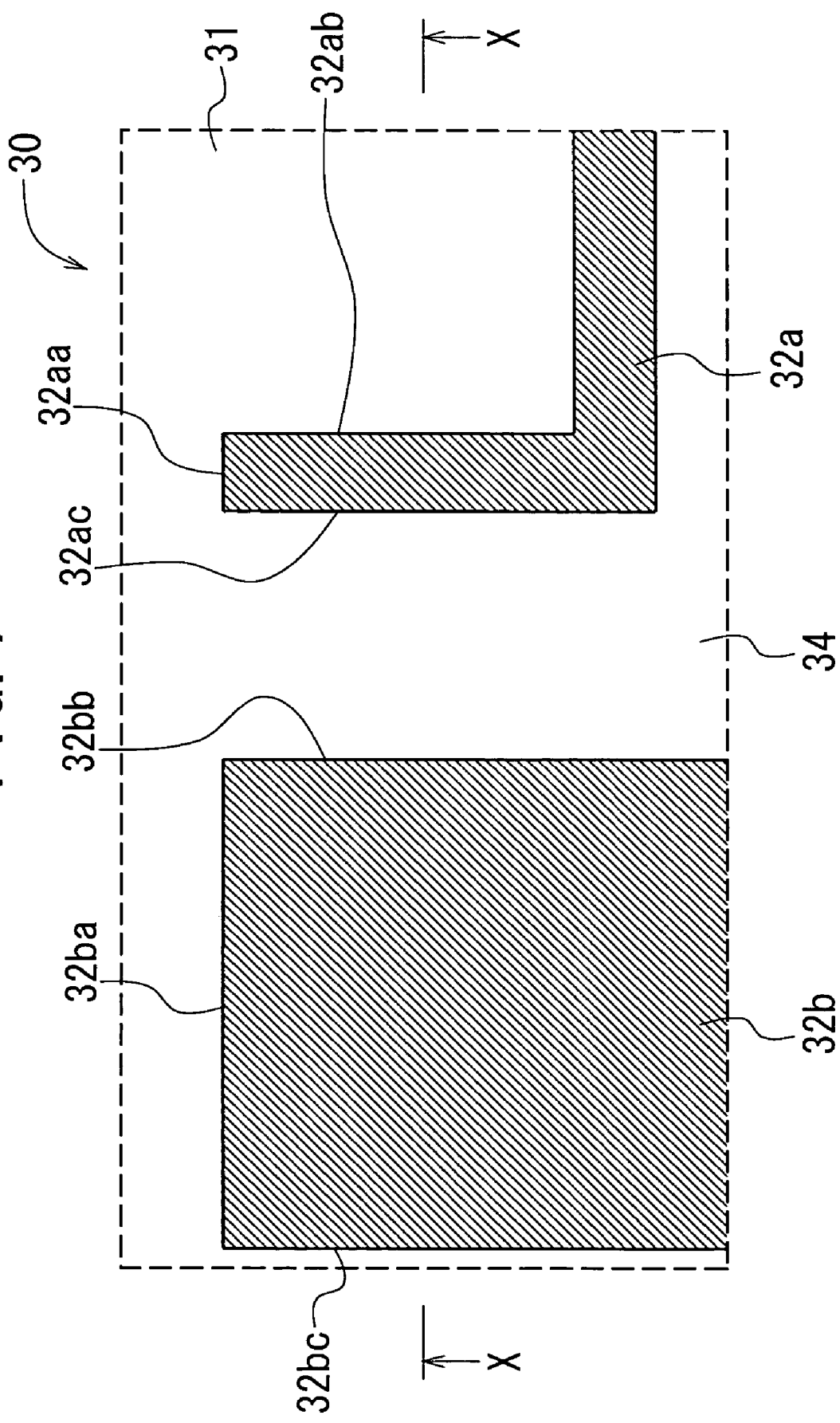
FIG. 7 is a schematic plan view showing the configuration of a non-phase-shifting mask, which is used in the pattern formation method of the first embodiment.

Next, a pattern formation method of the first embodiment is explained below. In this method, a non-phase-shifting mask 30 as shown in FIG. 7 is used along with the phase-shifting mask 20 of the first embodiment. Thus, the configuration of the mask 30 is explained first. The mask 30 is not of the Levenson-type.

The optical projection system used in this method has the numerical aperture (NA) of 0.68 and the optical illumination system used therein has the coherence factor σ of 0.3.

As shown in FIG. 7, the mask 30, which is of the positive type, has a L-shaped blocking part 32a and a rectangular blocking part 32b. The blocking part 32a is located to entirely overlap with the first pattern region R1 of the phase-shifting mask 20 of FIG. 6. The blocking part 32b is located to entirely overlap with the second pattern region R2 of the mask 20. The remaining area of the mask 30 that excludes the parts 32a and 32b is a transparent part 34.

If the mask 30 is entirely overlapped with the mask 20, the upper edge 32aa of the L-shaped blocking part 32a of the mask 30 accords approximately with the upper edge 23aa of the phase-shifting part 23a and the upper edge 24aa of the transparent part 24a. Similar to this, the right edge (not shown) of the blocking part 32a accords approximately with the right edge (not shown) of the phase-shifting part 23a and the right edge (not shown) of the transparent part 24a. On the other hand, the L-shaped side edge 32ab of the part 32a is located inside the L-shaped side edge 23ab of the part 23 of the mask 20, in other words, the side edge 32ab is located in the phase-shifting part 23a. Similarly, the L-shaped side edge 32ac of the part 32a is located inside the L-shaped side edge 24ab of the part 24 of the mask 20, in other words, the side edge 32ac is located in the transparent part 24a. These are to prevent the blocking part 32a of the mask 30 from badly affecting the formation of the pattern element 13a of the isolated pattern section 13.

Moreover, the upper edge 32ba of the rectangular blocking part 32b of the mask 30 accords approximately with the upper edges 23ba of the linear phase-shifting parts 23b and the upper edges 24ba of the linear transparent parts 24b. Similar to this, the lower edges (not shown) of the blocking part 32b accords approximately with the lower edges (not shown) of the phase-shifting parts 23b and the lower edges (not shown) of the transparent parts 24b. On the other hand, the linear side edge 32bb of the rectangular part 32b is located inside the linear side edge 24bb of the corresponding linear part 24b (which is located at the right end of FIG. 6) of the mask 20, in other words, the side edge 32bb is located in the corresponding transparent part 24b. Similarly, the linear side edge 32bc of the part 32b is located inside the linear side edge 24bc of the corresponding linear part 24b (which is located at the left end of FIG. 6) of the mask 20, in other words, the side edge 32bc is located in the corresponding transparent part 24b. These are to prevent the blocking part 32b of the mask 30 from badly affecting the formation of the pattern element 14a of the periodical pattern section 14.

Subsequently, the pattern formation method of the first embodiment using the masks 20 and 30 is explained below with reference to FIGS. 19 and 20.

Figure 19:
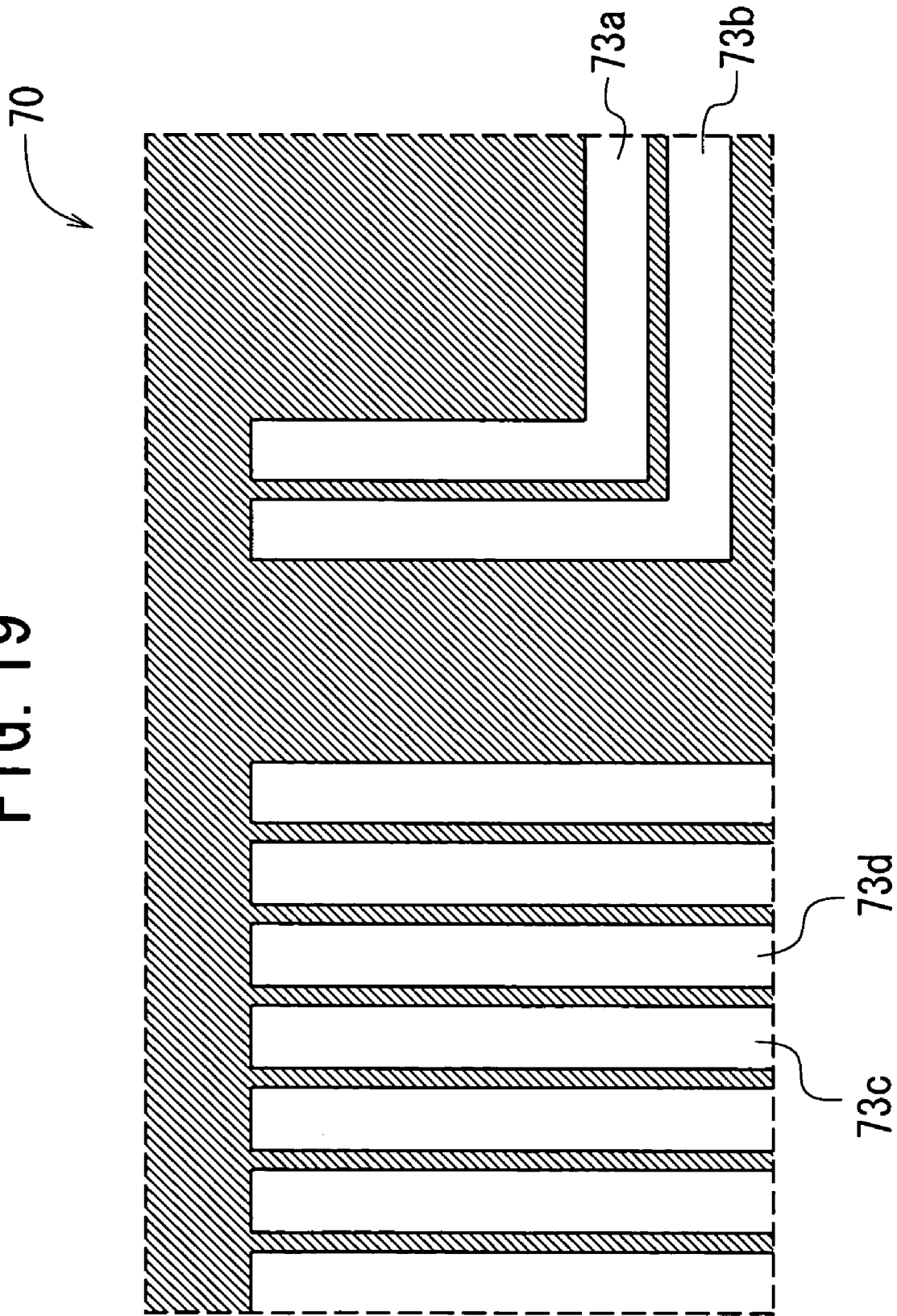
FIG. 19 is a schematic plan view showing the latent image formed in the photoresist film using the phase-shifting mask of FIG. 6 in the pattern formation method of the first embodiment.
Figure 20:
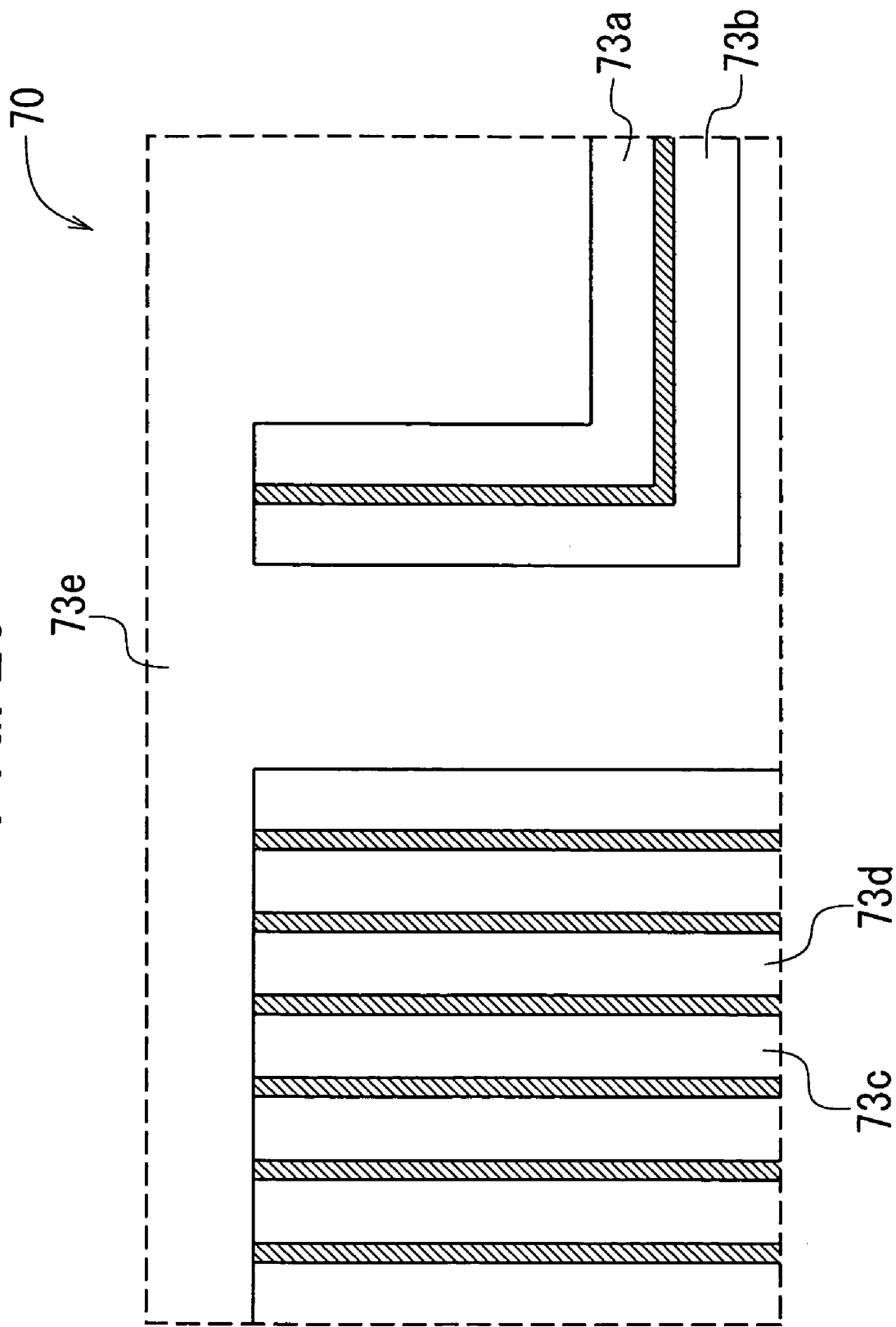
FIG. 20 is a schematic plan view showing the latent image formed in the photoresist film using the phase-shifting mask of FIG. 6 and the non-phase-shifting mask of FIG. 7 in the pattern formation method of the first embodiment.

First, as shown in FIG. 19, a photoresist film 70 with a specific thickness is formed on the object 12 for pattern formation (e.g., a polysilicon film formed on the gate dielectric film)

Next, the first exposure process is carried out by a known method using KrF excimer laser light (wavelength: 248 nm)

as an exposing light. In this process, the phase-shifting mask 20 of the first embodiment of FIG. 6 is used to selectively irradiate the exposing laser light to the photoresist film 70.

Through the first exposure process, the photoresist film 70 is exposed to the laser light at the corresponding positions to the L-shaped phase-shifting part 23a, the linear phase-shifting parts 23b, the L-shaped transparent part 24a, and the linear transparent parts 24b of the mask 20. As a result, a latent image (not shown) is formed in the film 70. This image comprises a L-shaped exposed part 73a corresponding to the phase-shifting part 23a, a L-shaped exposed part 73b corresponding to the transparent part 24a, three linear exposed parts 73c corresponding to the three phase-shifting parts 23b, and four linear exposed parts 73d corresponding to the four transparent parts 24b. The remaining area of the film 70 excluding the parts 73a, 73b, 73c, and 73d is not exposed.

After the first exposure process is completed, the second exposure process is carried out using the mask 30 in a similar way to the first exposure process.

Specifically, the photoresist film 70 shown in FIG. 19, to which the exposing laser light has been irradiated once, is selectively exposed to the same exposing light using the mask 30. The L-shaped blocking part 32a of the mask 30 covers entirely the L-shaped exposed parts 73a and 73b of the film 70, and the rectangular blocking part 32b of the mask 30 covers entirely the linear exposed parts 73c and 73d. Therefore, these exposed parts 73a, 73b, 73c, and 73d are not affected by the exposing light irradiated with the mask 30. However, the remaining unexposed area of the film 70 that excludes the parts 73a, 73b, 73c, and 73d are exposed to the light. As a result, as shown in FIG. 20, a remaining exposed part 73e is formed in the unexposed part of the film 70.

In this way, a latent image having substantially the same pattern as the desired circuit/element pattern 10 is formed in the photoresist film 70.

In the pattern formation method of the first embodiment, unlike the previously-explained prior-art pattern formation method, no undesired latent image is formed in the photoresist film 70 due to the 0-π phase edges in the first exposure process. Therefore, the second exposure process is carried out to expose the unexposed part of the film 70 in the first exposure process.

Subsequently, the photoresist film 70 thus exposed twice is developed with a known developer solution, thereby eliciting the latent image. Thus, the film 70 is patterned as desired. This means that the desired circuit/element pattern 10 of FIG. 8 is formed on the object 12.

Using the circuit/element pattern 10 of FIG. 8 as a mask for the object 12, the object 12 (e.g., a polysilicon film) is selectively etched by a known etching method. Thus, the pattern 10 is transferred to the object 12.

With the pattern formation method according to the first embodiment, as explained above, the first exposure process is carried out for the photoresist film 70 using the phase-shifting mask 20 of the first embodiment and then, the second exposure process is carried out for the same film 70 using the non-phase-shifting mask 30, thereby forming the latent image of the desired circuit/element pattern 10 in the film 70. Therefore, the penetrated light intensity through the first pattern region R1 of the mask 20 is approximately equal to that through the second pattern region R2 thereof. Thus, the optical proximity effect can be effectively suppressed.

Moreover, the unexposed part of the photoresist film 70 through the first exposure process, which is left unexposed because of the remaining blocking part 22c of the phase-shifting mask 20, is exposed in the second exposure process using the mask 30. Therefore, the remaining blocking part 22c applies no bad effect to the exposure of the film 70.

Figure 11:
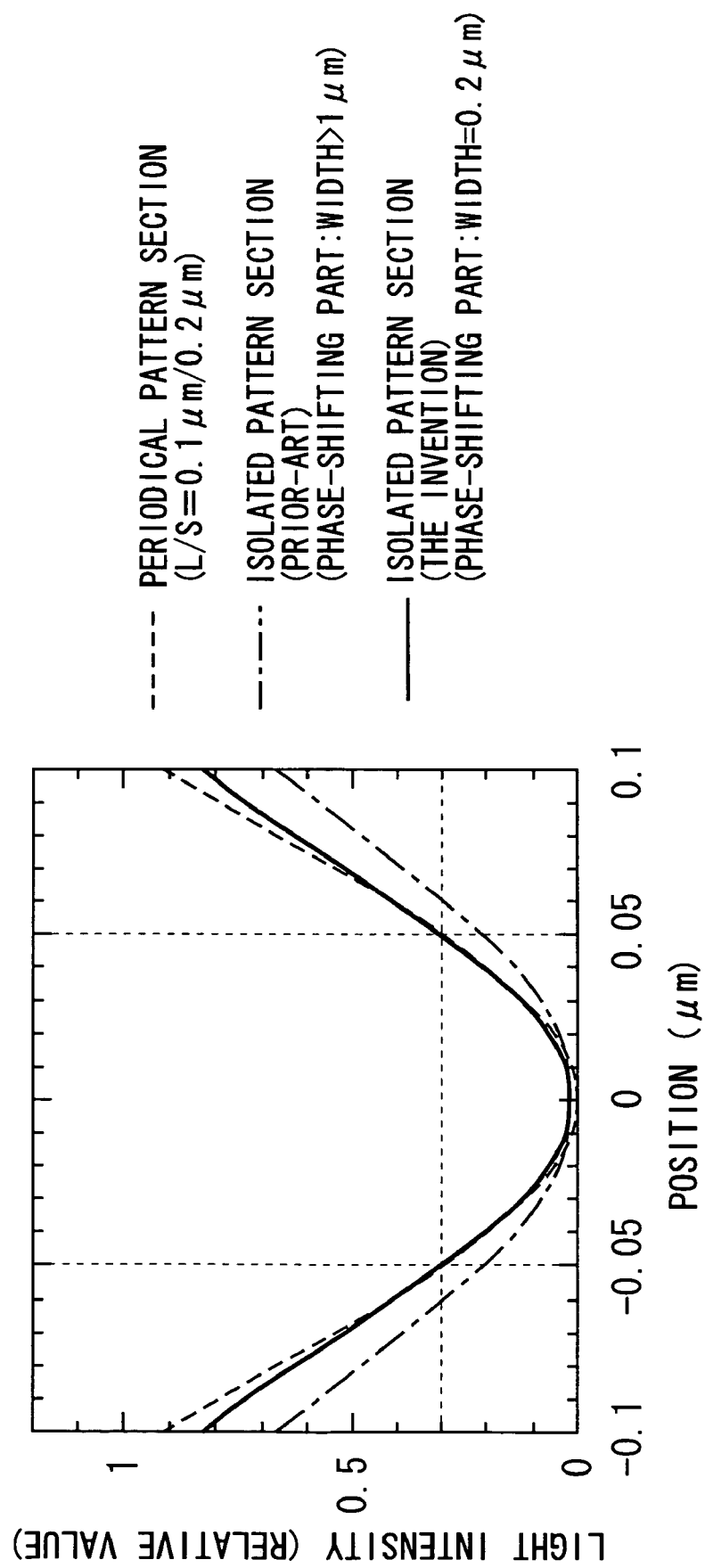
FIG. 11 is a graph showing the relationship between the penetrated light intensity and the position obtained by using the phase-shifting mask according to the first embodiment.
Figure 12:
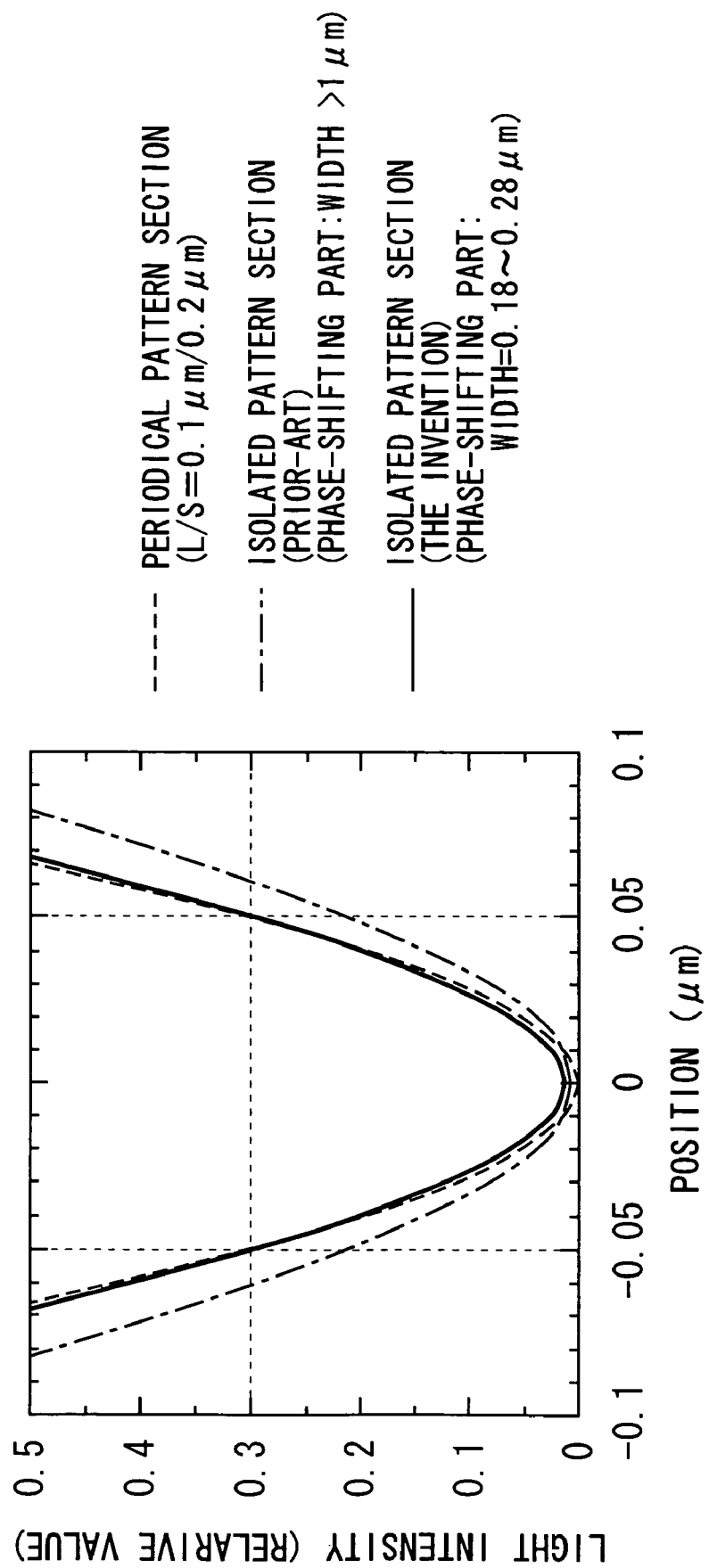
FIG. 12 is a graph showing the relationship between the penetrated light intensity and the position obtained by using a variation of the phase-shifting mask according to the first embodiment.

FIGS. 11 and 12 show the result of experiments performed by the inventor.

FIG. 11 shows the intensity change of the exposing light passing through the phase-shifting mask 20 of the first embodiment as a function of the position, where the light intensity is shown with relative values. In FIG. 11, each of the periodically-arranged blocking parts 22b located in the second pattern region R2 has the width $W_{S2}$ of 0.1 μm, and each of the periodically-arranged phase-shifting parts 23b and the transparent parts 24b located therein has the width $W_{P2}$ or $W_{O2}$ of 0.2 μm. The isolated blocking part 22a located in the first pattern region R1 has the width $W_{S1}$ of 0.1 μm, and the isolated phase-shifting part 23a and the transparent parts 24a located therein has the width $W_{P2}$ or $W_{O2}$ of 0.2 μm. The lateral axis of FIG. 11 denotes the distance from the center line of the blocking part 22a or 22b in a perpendicular direction thereto. The position "0" is located on the line.

Figure 4:
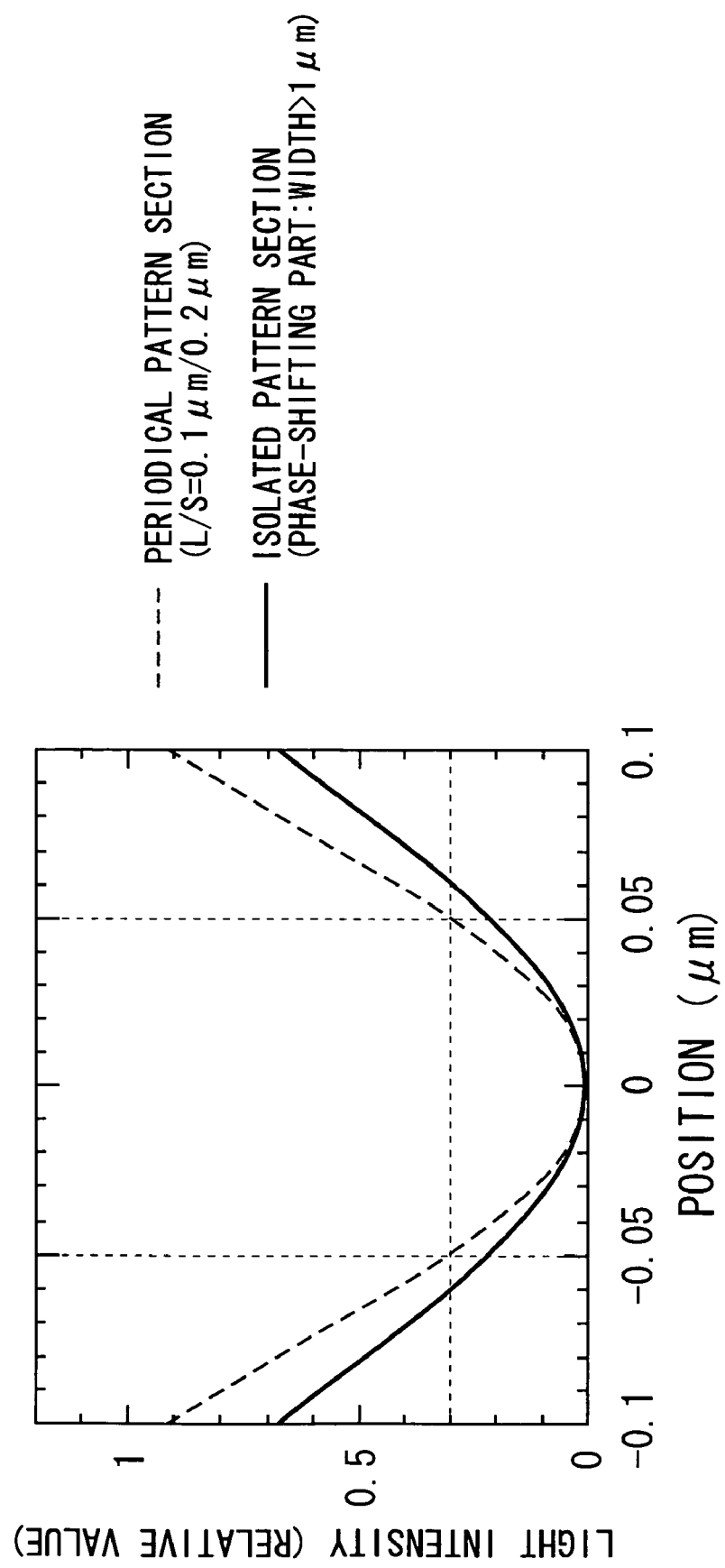
FIG. 4 is a graph showing the relationship between the penetrated light intensity and the position obtained by using the prior-art phase-shifting mask.

As seen from the solid curve in FIG. 11, the intensity of the penetrated light through the first pattern region R1 (which includes the isolated blocking part 22a, the isolated phase-shifting part 23a, and the isolated transparent part 24a) increases gradually as the position is shifted away from the center of the blocking part 22a. Similarly, as seen from the broken curve in FIG. 11, the intensity of the penetrated light through the second pattern region R2 (which includes the periodically-arranged blocking parts 22b, the periodically-arranged phase-shifting parts 23, and the periodically-arranged transparent parts 24b) increases gradually as the position is shifted away from the center of the blocking part 22a. The increasing rate of the solid curve for the region R1 is approximately equal to that of the broken curve for the region R2, which is unlike the prior-art method of FIG. 4. Accordingly, the minimum, formable pattern-element size for the photoresist film 70 is kept approximately the same value even if the inter-element distance is 0.5 μm or greater (i.e., even if a pattern is isolated).

In the above explanation, the width $W_{P1}$ of the L-shaped phase-shifting part 23a of the mask 20 is equal to the width $W_{P2}$ of the linear phase-shifting parts 23b thereof (i.e., $W_{P1}=W_{P2}=0.2$ μm). However, the width $W_{P1}$ of the L part 23a needs not be equal to the width $W_{P2}$ of the parts 23b. As seen from FIG. 12, if the width $W_{P1}$ of the part 23a is in the range of 0.18 μm to 0.28 μm, in other words, if $W_{P1}=(0.9-1.4) \times W_{P2}$ is established, approximately the same advantages are obtainable.

Second Embodiment

Figure 13:
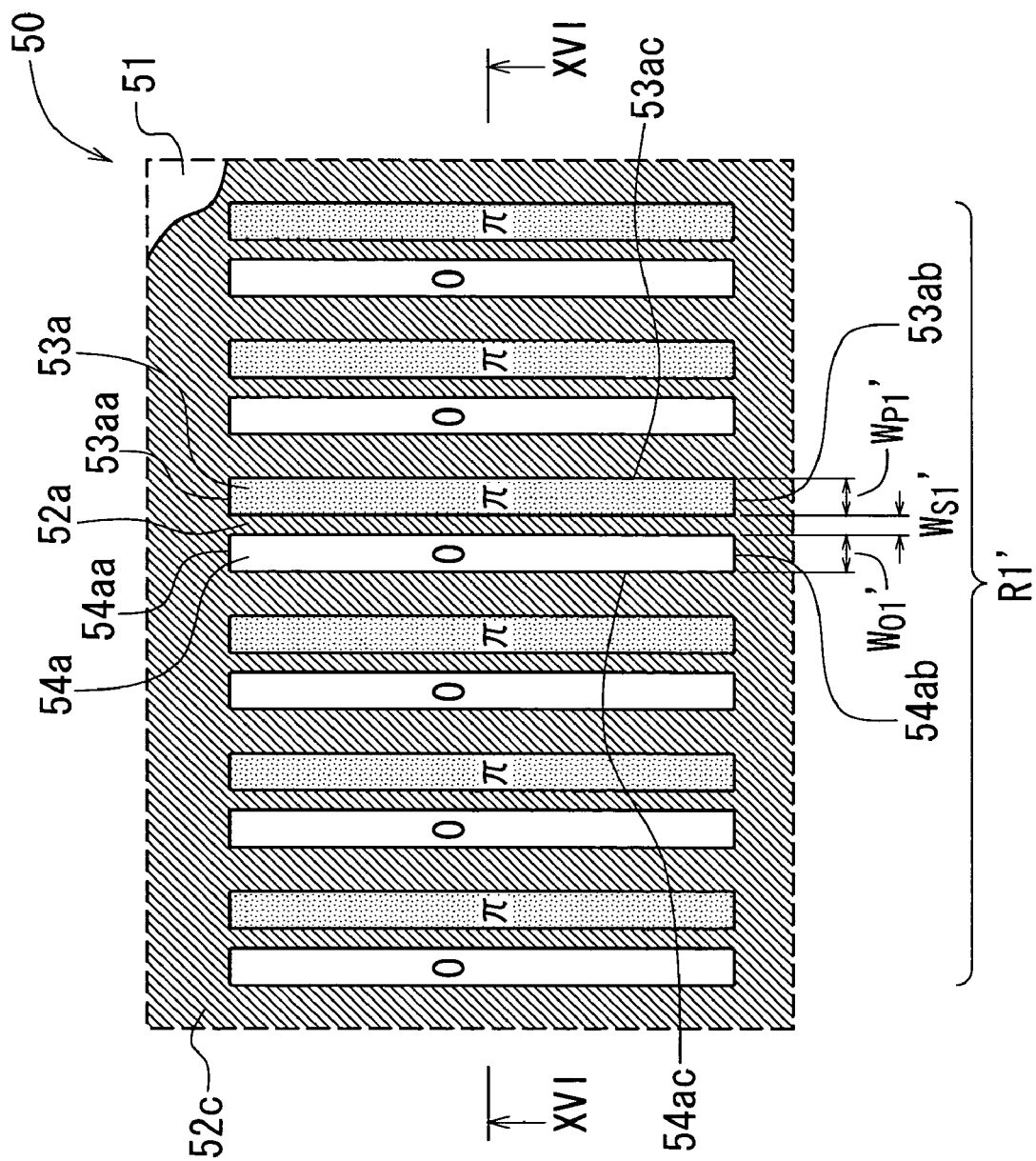
FIG. 13 is a schematic plan view showing the configuration of a phase-shifting mask according to a second embodiment of the invention, which is used in a pattern formation method according to the second embodiment.
Figure 15:
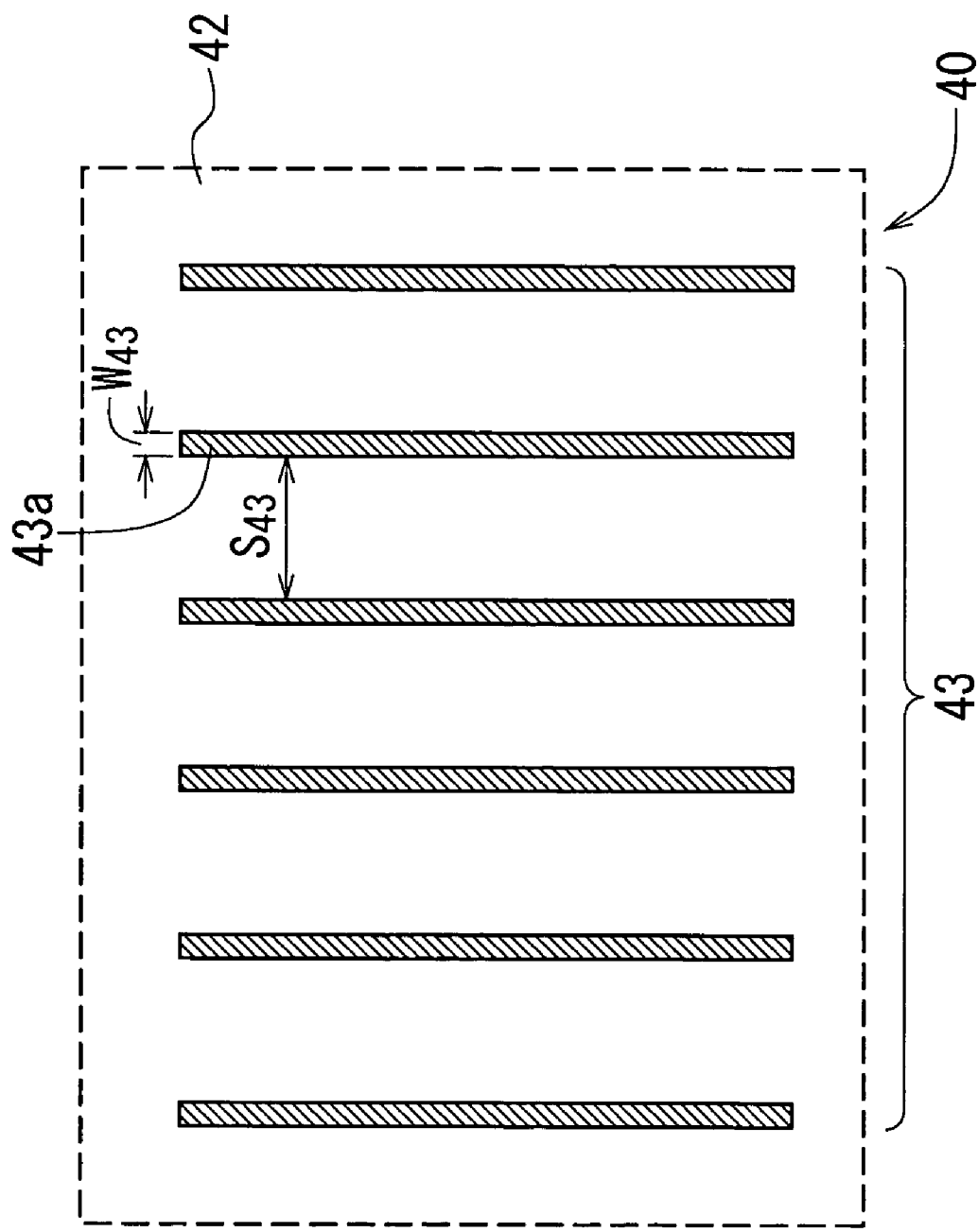
FIG. 15 is a schematic plan view showing a circuit/element pattern to be formed by the pattern formation method of the second embodiment.

FIG. 15 shows a circuit/element pattern 40 to be formed using a Levenson-type phase-shifting mask 50 according to a second embodiment shown in FIG. 13. Like the first embodiment, this pattern 40 is used to pattern a conductive film formed on a gate dielectric film, thereby forming the gate electrodes of MOSFETs and the wiring lines connected thereto. The pattern 40 is made of any photoresist film.

Figure 5:
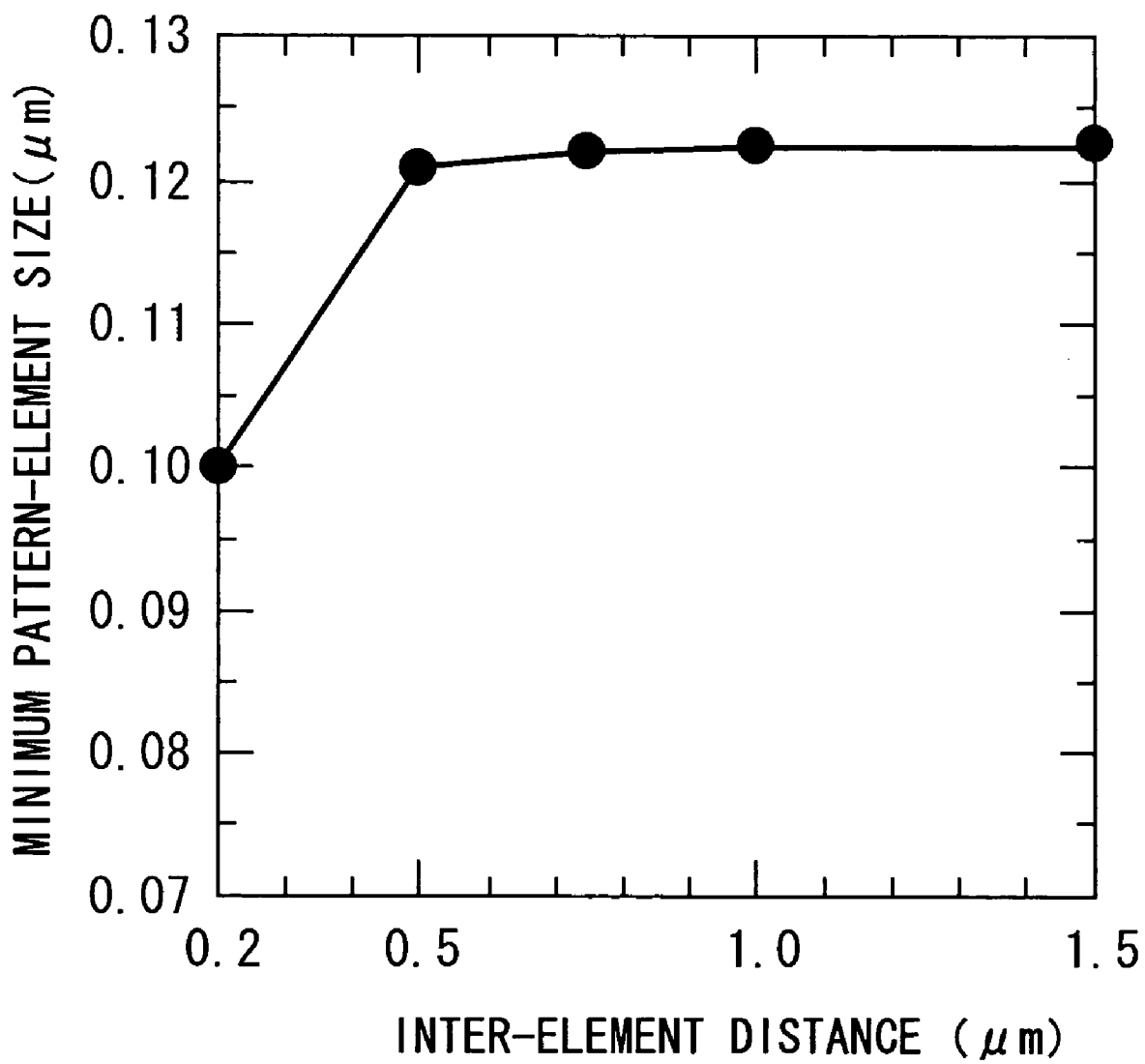
FIG. 5 is a graph showing the relationship between the minimum, formable pattern element size on the photoresist film and the inter-element distance in the prior-art pattern formation method.

In FIG. 5, only a L/S periodic pattern section 43 of the pattern 40 is shown. However, actually, the pattern 40 comprises further a L/S periodic pattern section (not shown) with the same configuration as the L/S periodic pattern section 14 of FIG. 8. Thus, it may be said that the pattern 40 is formed by replacing the isolated pattern section 13 with the L/S periodic pattern section 43 in the pattern 10 of the first embodiment.

The periodic section 43 includes six linear pattern elements 43a arranged in parallel at equal intervals. No other pattern elements are located near the section 43. All the elements 43a have the same width $W_{43}$ of 0.1 µm and the same spaces or intervals $S_{43}$ of 0.5 µm.

Figure 16:
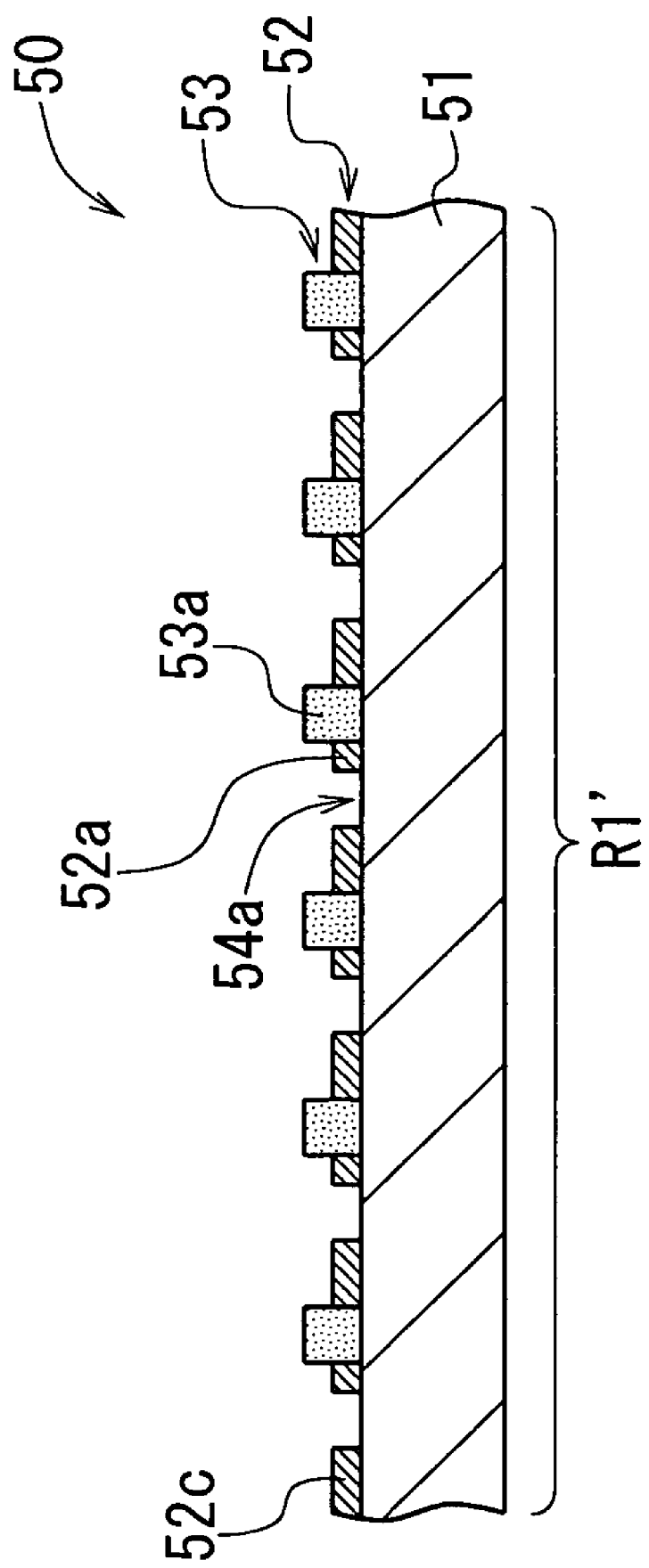
FIG. 16 is a cross-sectional view along the line XVI-XVI in FIG. 13.

FIG. 13 shows the configuration of the phase-shifting mask 50 according to the second embodiment and FIG. 16 shows the cross-section along the line XVI-XVI in FIG. 13. This mask 50 is of the Levenson type.

The mask 50, which is of the positive type, comprises a first pattern region R1' corresponding to the L/S pattern section 43 of the circuit/element pattern 40 of FIG. 15 and a second pattern region R2 (not shown in FIG. 13) corresponding to the L/S pattern section 14 (not shown) of the pattern 40. The first and second pattern regions R1' and R2 are formed on a main surface of a transparent substrate 51.

In the first pattern region R1', six linear blocking parts 52a are arranged in parallel at equal intervals to form the linear pattern elements 43a of the section 43. A linear strip-like phase-shifting part 53a is closely formed at one side of each part 52a while a linear strip-like transparent part 54a is closely formed at the other side thereof. Thus, each of the blocking parts 52a is sandwiched by the corresponding phase-shifting part 53a and the corresponding transparent part 54a. These two parts 53a and 54a extend along the blocking part 52a from its one end to the other.

In the other region of the surface of the substrate 51 than the first and second pattern regions R1' and R2, a remaining blocking part 52c is formed. This is quite different from the prior-art phase-shifting mask 120 of FIG. 1 where the other region is the transparent part 124.

As seen from FIG. 16, the blocking parts 52a and 52c are formed by forming a blocking layer 52 on the main surface of the transparent substrate 51 and by patterning the layer 52 thus formed. The phase-shifting parts 53a are formed by forming a phase-shifting layer 53 on the main surface of the substrate 51 and by patterning the layer 53 thus formed. The transparent parts 54a are formed by the area of the substrate 51 where none of the layers 52 and 53 is placed.

In the first pattern region R1' of the mask 50, the linear blocking parts 52a have the same shape as the pattern elements 43a of the L/S pattern section 43 of the circuit/element pattern 40 of FIG. 15. The width $W_{S1}'$ of the blocking parts 52a is equal to the width $W_{43}$ of the elements 43a of the pattern 40, i.e., $W_{S1}'=W_{43}=0.1$ µm.

The strip-shaped phase-shifting parts 53a extend along the strip-shaped blocking parts 52a and have approximately the same shape as the pattern elements 43a of the pattern 40. The width $W_{P1}'$ of the phase-shifting parts 53a is equal to the width $W_{P2}$ of the linear phase-shifting parts 23b. Since the width $W_{P2}$ of the part 23b is equal to the space $S_{14}$ of the elements 14a of the pattern 40, the relationship of $W_{P1}'=W_{P2}=S_{14}=0.2$ µm is established.

The strip-shaped transparent parts 54a extends along the blocking parts 52a and has approximately the same shape as the blocking part 52a. The width $W_{O1}'$ of the transparent parts 54a is equal to the width $W_{P2}$ of the phase-shifting parts 23a, i.e., $W_{O1}'=W_{P2}=0.2$ µm.

The remaining area of the surface of the substrate 51 other than the first and second pattern regions R1' and R2 is covered with the remaining blocking part 52c.

All the linear blocking parts 52a have the same length as that of the phase-shifting parts 53a and the transparent parts 54a. All the blocking parts 52a are connected to the blocking part 52c at the ends of the parts 53a and 54a.

With the above-described phase-shifting mask 50 according to the second embodiment, on the surface of the transparent substrate 51, the first pattern region R1' including the six periodically-arranged blocking parts 52a, and the second pattern region R2 including the six periodically-arranged blocking parts 22b far away from the region R1' are formed. The remaining area of the surface of the substrate 51 that excludes the regions R1' and R2 is covered with the remaining blocking part 52c. The width $W_{P1}'$ of the phase-shifting parts 53a in the first region R1' is equal to the width $W_{P2}$ of the phase-shifting parts 23b in the second region R2, i.e., $W_{P1}'=W_{P2}$. Thus, the intensity of the penetrated light through the first pattern region R1' can be approximately equalized to the intensity of the penetrated light through the second pattern region R2.

As a result, like the first embodiment, the opposite phase interference at the 0-π edges is suppressed in the first pattern region R1', which means that the "optical proximity effect" can be suppressed effectively. Accordingly, the dispersion or fluctuation of the minimum size of discriminable or formable pattern elements using the phase-shifting mask 50 of the second embodiment can be significantly reduced, improving the resolution. This highly contributes to the increase in fabrication yield.

Figure 14:
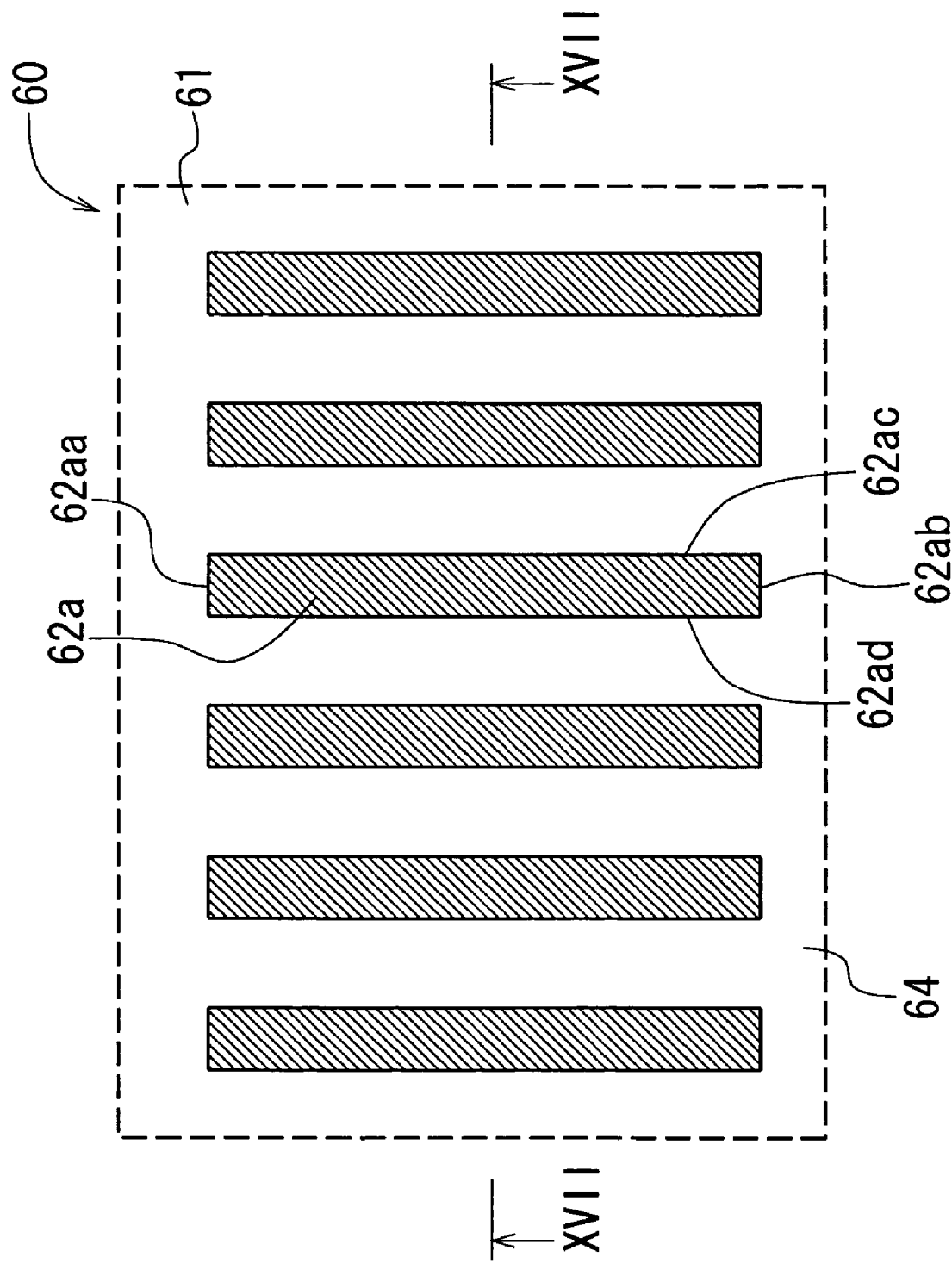
FIG. 14 is a schematic plan view showing the configuration of a non-phase-shifting mask, which is used in the pattern formation method of the second embodiment.
Figure 17:
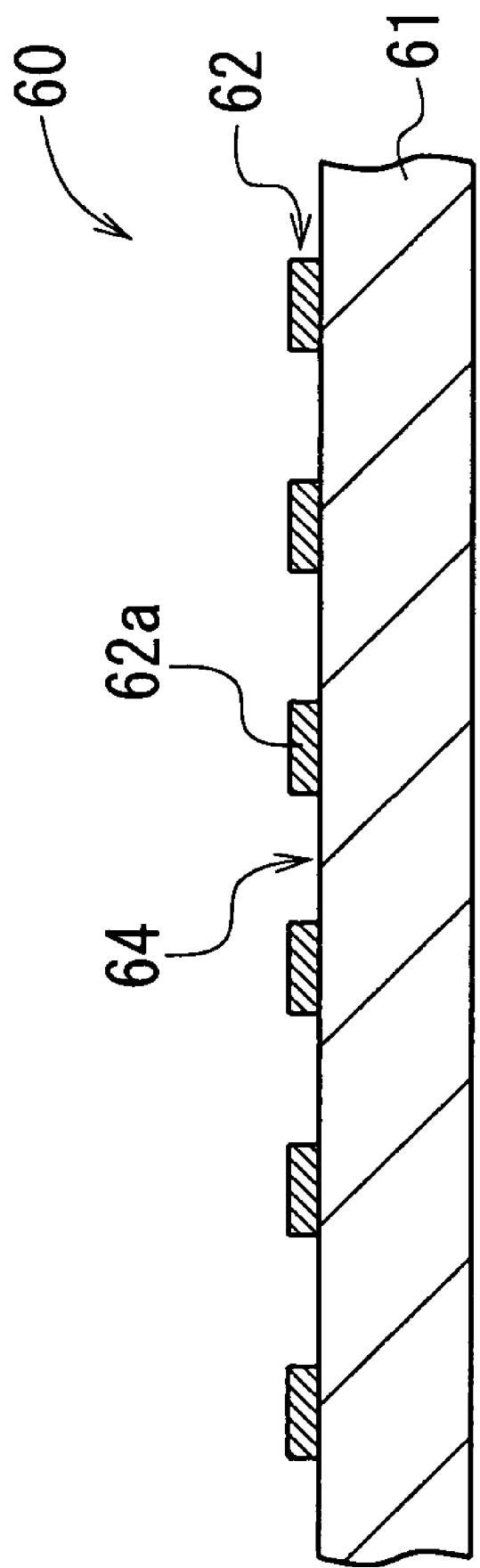
FIG. 17 is a cross-sectional view along the line XV-XV in FIG. 14.

FIG. 14 shows the configuration of the mask 60 used in the pattern formation method of the second embodiment, and FIG. 17 shows the cross-section along the line XVII-XVII in FIG. 14. The mask 60 is a non-phase-shifting mask.

The mask 60 of FIG. 14, which is of the positive type, has six linear blocking parts 62a and the rectangular blocking part 32b. The blocking parts 62a are located to entirely overlap with the first pattern region R1' of the phase-shifting mask 50 of FIG. 13. The blocking part 32b is located to entirely overlap with the second pattern region R2 of the mask 50. The remaining area of the mask 60 that excludes the parts 62a and 32b is a transparent part 64.

If the mask 60 is entirely overlapped with the mask 50, the upper edges 62aa of the blocking parts 62a of the mask 60 accord approximately with the corresponding upper edges 53aa of the phase-shifting parts 53a and the corresponding upper edges 54aa of the transparent parts 54a. Similar to this, the lower edges 62ab of the blocking parts 62a accord approximately with the lower edges 53ab of the phase-shifting parts 53a and the lower edges 54ab of the transparent part 54a.

On the other hand, the side edge 62ac of the part 62a at the right end of FIG. 14 is located inside the corresponding side edge 53ac of the part 53a of the mask 50, in other words, the side edge 62ac is located in the phase-shifting part 53a. Similarly, the side edge 62ad of the part 62a at the left end of FIG. 14 is located inside the corresponding side edge 54ab of the part 54a of the mask 50, in other words, the side edge 62ad is located in the transparent part 54a. These are to prevent the blocking parts 62a of the mask 60 from badly affecting the formation of the pattern elements 43a of the pattern section 43.

Subsequently, the pattern formation method of the second embodiment using the masks 50 and 60 is explained below.

First, a photoresist film 70 with a specific thickness is formed on the object 12 for pattern formation (e.g., a polysilicon film formed on the gate dielectric film).

Next, the first exposure process is carried out by a known method using the same laser light as used in the first embodiment. In this process, the phase-shifting mask 50 of the second embodiment of FIG. 13 is used to selectively irradiate the exposing laser light to the photoresist film 70.

Through the first exposure process, the photoresist film 70 is exposed to the laser light at the corresponding positions to the linear phase-shifting parts 53a and the linear transparent parts 54a of the mask 50. As a result, a latent image (not shown) is formed in the film 70. This image comprises linear exposed parts (not shown) corresponding to the parts 53a and 54a, and linear exposed parts (not shown) corresponding to the parts 23b and 24b. The remaining area of the film 70 excluding these exposed parts is not exposed.

After the first exposure process is completed, the second exposure process is carried out using the mask 60 of FIG. 14 in a similar way to the first exposure process.

Specifically, the photoresist film 70 shown in FIG. 19, to which the exposing laser light has been irradiated once, is selectively exposed to the same exposing light using the mask 60. The linear blocking parts 62a of the mask 60 cover entirely the corresponding exposed parts of the film 70, and the rectangular blocking part 32b of the mask 60 covers entirely the corresponding exposed parts. Therefore, none of the exposed parts are affected by the exposing light irradiated with the mask 60. However, the remaining unexposed area of the film 70 are exposed to the light. As a result, a remaining exposed part is formed in the unexposed part of the film 70.

In this way, a latent image having substantially the same pattern as the desired circuit/element pattern 40 of FIG. 15 is formed in the photoresist film 70.

Subsequently, the photoresist film 70 thus exposed twice is developed with a known developer solution, thereby eliciting the latent image. Thus, the film 70 is patterned as desired. This means that the desired circuit/element pattern 40 of FIG. 15 is formed on the object 12.

Using the circuit/element pattern 40 of FIG. 15 as a mask for the object 12, the object 12 (e.g., a polysilicon film) is selectively etched by a known etching method. Thus, the pattern 40 is transferred to the object 12.

With the pattern formation method according to the second embodiment, as explained above, because of the same reason as shown in the first embodiment, the same advantages as those of the first embodiment are obtainable.

Figure 18:
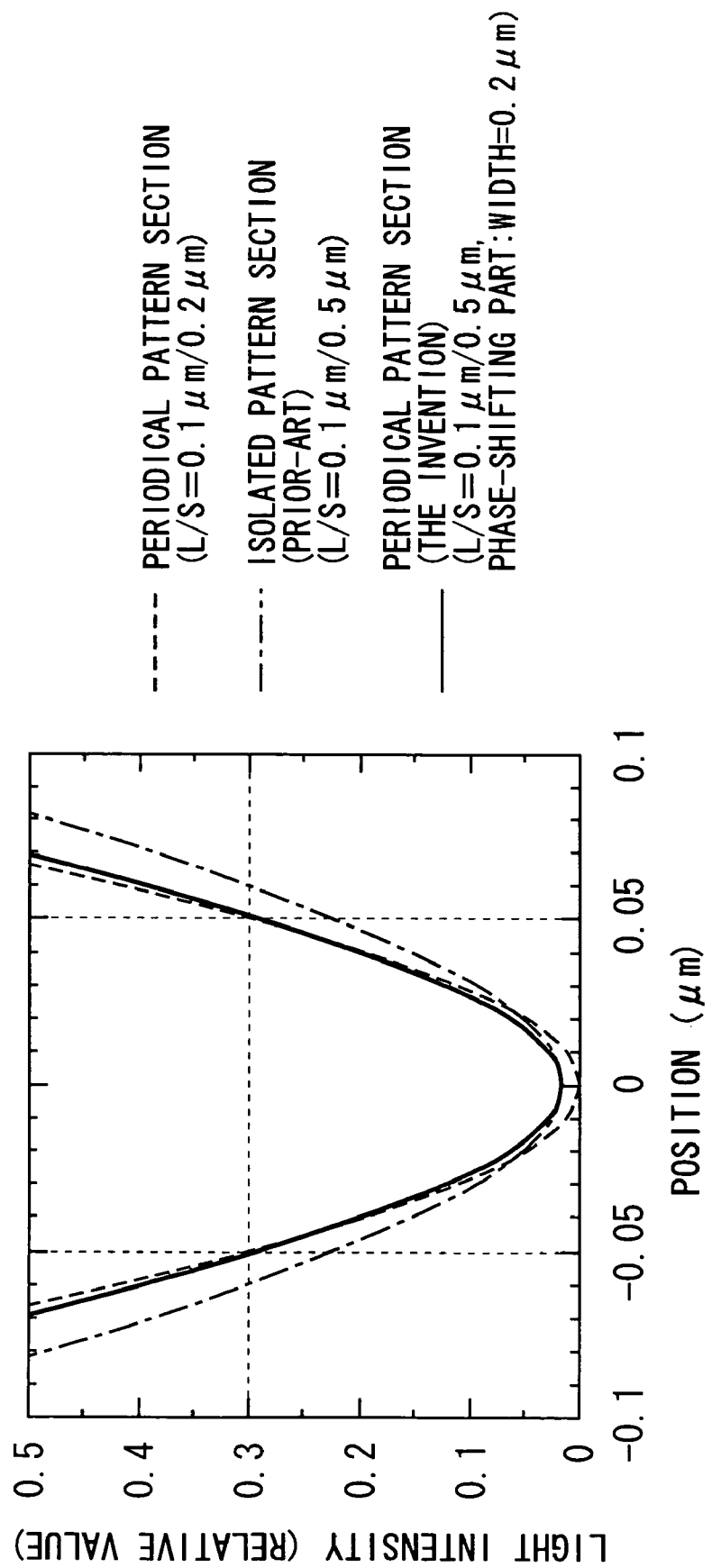
FIG. 18 is a graph showing the relationship between the penetrated light intensity and the position obtained by using the phase-shifting mask according to the second embodiment.

FIG. 18 shows the result of experiments performed by the inventor.

As seen from the solid curve in FIG. 18, the intensity of the penetrated light through the first pattern region R1' (which includes the blocking parts 52a, the phase-shifting parts 53a, and the transparent parts 54a) increases gradually as the position is shifted away from the center of the blocking part 52a. The increasing rate of the solid curve for the region R1' is approximately equal to that of the broken curve for the region R2, which is unlike the prior-art method of FIG. 4. Accordingly, the minimum, formable pattern-element size for the photoresist film 70 is kept approximately the same value even if the inter-element distance is 0.5 µm or greater (i.e., even if a pattern is isolated).

VARIATIONS

Needless to say, the present invention is not limited to the above-described first and second embodiments. Any change or modification may be added to the embodiment within the spirit of the invention.

For example, in the above-described embodiments, the L-shaped pattern element and the linear element are referred. However, the invention is not limited to this case. It is needless to say that the invention is applicable to any pattern elements with any other shape.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of forming a pattern, comprising:
   (a) providing as a first mask a phase-shifting mask comprising:
      a transparent substrate;
      a first pattern region formed on the substrate;
      the first pattern region including a first blocking part for forming at least one first pattern element;
      a second pattern region formed on the substrate;
      the second pattern region including second blocking parts for forming second pattern elements arranged periodically;
      in the first pattern region, a first phase-shifting part formed at one side of the first blocking part and a first transparent part formed at an opposite side of the first blocking part to the first phase-shifting part;
      in the second pattern region, a second phase-shifting part formed at one side of each of the second blocking parts and a second transparent part formed at an opposite side of the second blocking part to the second phase-shifting part;
      a width of the first-phase shifting part in the first pattern region having a relationship with a width of the second-phase shifting part in the second pattern region in such a way that an intensity of exposing light penetrated through the first pattern region is approximately equal to an intensity of the exposing light penetrated through the second pattern region;
      a third blocking part formed on the substrate to surround the first phase-shifting part and the first transparent part in the first pattern region; and
      a fourth blocking part formed on the substrate to surround the second phase-shifting part and the second transparent part in the second pattern region;
   (b) providing a non-phase-shifting second mask;
      the second mask including a transparent substrate, a fifth blocking part that covers entirely the first blocking part of the first mask, a sixth blocking part that covers entirely the second blocking part of the first mask, and a third transparent part for exposing the third and fourth blocking parts of the first mask;
   c) selectively irradiating exposing light to a photoresist film formed on an pattern-formation object using the first mask;
   (d) selectively irradiating the exposing light to the photoresist film using the second mask after (c); and
   (e) developing the photoresist film after (d),
   wherein the first phase-shifting part of the first pattern region has a width 0.9 to 1.4 times as large as a width of the second phase-shifting part of the second pattern region, and the at least one first pattern element is an isolated pattern element.

2. The method according to claim 1,
   wherein the second mask is overlapped with the first mask, an edge of the fifth blocking part of the second mask is located in the first phase-shifting part of the first mask while an opposite edge of the fifth blocking part of the second mask is located in the first transparent part of the first mask; and
   wherein an edge of the sixth blocking part of the second mask is located in the corresponding second phase-shifting part or the second transparent part of the first mask while an opposite edge of the sixth blocking part of the second mask is located in the corresponding second phase-shifting part or the second transparent part of the first mask.

3. The method according to claim 1, wherein the first phase-shifting part of the first pattern region has a width approximately equal to a width of the second phase-shifting part of the second pattern region.

4. The method according to claim 1, wherein the at least one first pattern element is pattern elements periodically arranged at larger intervals than the second pattern elements.

5. The method according to claim 4, wherein the intervals of the periodically-arranged pattern elements are approximately twice as large as that of the second pattern elements or larger.

6. The method according to claim 4, wherein the first phase-shifting part of the first pattern region has a width approximately equal to a width of the second phase-shifting part of the second pattern region.

7. The method according to claim 1, wherein the third blocking part of the first pattern region and the fourth blocking part of the second pattern region are combined together.

8. The method according to claim 1, wherein the first blocking part has an L-shape.

9. The method according to claim 1, wherein the second blocking parts are linear shaped.

10. The method according to claim 1, wherein there are 6 second blocking parts.

11. The method according to claim 1, wherein the first phase shifting part has a phase shift of 180°, and the second phase shifting part has a phase shift of 180°.

* * * * *